United States Patent [19]

Cheng et al.

[11] Patent Number: 5,608,396
[45] Date of Patent: Mar. 4, 1997

[54] EFFICIENT ZIV-LEMPEL LZI DATA COMPRESSION SYSTEM USING VARIABLE CODE FIELDS

[75] Inventors: Joe-Ming Cheng, Cupertino, Calif.; David J. Craft, Austin, Tex.; Larry J. Garibay, San Jose, Calif.; Ehud D. Karnin, Koranit, Israel

[73] Assignee: International Business Machines Corporation, Armonk, N.Y.

[21] Appl. No.: 395,343

[22] Filed: Feb. 28, 1995

[51] Int. Cl.⁶ .................................................. H03M 7/38
[52] U.S. Cl. ........................ 341/50; 341/87; 341/95; 341/51; 341/59; 341/63; 341/106
[58] Field of Search ............................. 341/82, 95, 50, 341/51, 59, 63, 106

[56] References Cited

U.S. PATENT DOCUMENTS

| | | | |
|---|---|---|---|
| 4,054,951 | 10/1977 | Jackson et al. | 364/900 |
| 4,464,650 | 8/1984 | Eastman et al. | 340/347 |
| 4,814,746 | 3/1989 | Miller et al. | 341/95 |
| 5,003,307 | 3/1991 | Whiting et al. | 341/51 |
| 5,087,913 | 1/1992 | Eastman | 341/95 |
| 5,126,739 | 6/1992 | Whiting et al. | 341/106 |
| 5,150,119 | 9/1992 | Yoshida et al. | 341/51 |
| 5,151,697 | 9/1992 | Bunton | 341/51 |
| 5,153,591 | 10/1992 | Clark | 341/51 |
| 5,406,279 | 4/1995 | Anderson et al. | 341/51 |
| 5,414,425 | 5/1995 | Whiting et al. | 341/67 |

FOREIGN PATENT DOCUMENTS

0350281A1  10/1990  European Pat. Off. .

OTHER PUBLICATIONS

Kent Anderson, "Methods of Data Compression after the Manner of Lempel and Ziv", *Optical Information Systems*, Jan.–Feb. 1990, pp. 40–43.

J. Ziv and A. Lempel, "Compression of Individual Sequences via Variable–Rate Coding", *IEEE Transactions on Information Theory*, vol. IT–24, No. 5, Sep. 1978, pp. 530–536.

V. S. Miller et al., "Variations on a Theme by Ziv and Lempel", *IBM Research Report RC10630*, Jul. 1984, pp. 1–11.

J. Ziv. and A. Lempel, "A Universal Algorithm for Sequential Data Compression", *IEEE Transactions on Information Theory*, vol. IT–23, No. 3, May 1977, pp. 337–343.

(List continued on next page.)

*Primary Examiner*—Jeffrey A. Gaffin
*Assistant Examiner*—Jason H. Vick
*Attorney, Agent, or Firm*—Baker, Maxham, Jester & Meador

[57] ABSTRACT

A system for compressing digital data at one byte-per-cycle throughput by removing redundancy before storage or transmission. The system includes an improved Ziv-Lempel LZ1 process that uses a history buffer to save the most recent source string symbols for use in encoding the source symbols as "match-length" and "match-offset" tokens. The match-length code symbols are selected from two groups of buckets that are assigned variable-length prefixes for the shorter, more probable match-lengths and a fixed-length prefix code for the longer, less probable match-lengths. This exploits a transition from Laplacian match-length probability distribution to Uniform match-length probability distribution for longer match-lengths. The offset code field length is reduced during start-up to improve start-up compression efficiency during filling of the history buffer. The match-length code book is limited to a maximum value T<256 to limit latency and simplify the process. Several unused match-length code slots are reassigned to "control codes" that can be inserted into the compressed data stream on the fly without slowing or interrupting the encoding process. Compressed data is verified on the fly by simultaneous decode and CRC comparison with source data, permitting insertion of error-correction "control codes" as necessary without interruption or slowing of the compression flow.

35 Claims, 10 Drawing Sheets

OTHER PUBLICATIONS

D. Whiting, "A Comparison of Stac and Hewlett–Packard Data Compression Methods", Stac Electronics, Nov. 1989, pp. 1–10.

R. Lutz, "9703/9704 Design Guide", *Stac Electronics Application Note APP–0006*, Stac Electronics, Jul. 1990, pp. 720–726.

D. R. Helman, "General Purpose Data Compression ICs", *IEEE*, 1991, pp. 344–348.

"Data Compression Format for 1/4–inch Data Cartridge Tape Drives", Development Standard QIC–122, rev. B, Feb. 6, 1991, Quarter–inch Cartridge Drive Standards, pp. 1–4.

T. Welch, "A Technique for High–Performance Data Compression", *IEEE Computer*, Jun. 1984, pp. 8–19.

G. Langdon, Jr., "A Note on the Ziv–Lempel Model for Compressing Individual Sequences", *IEEE Transactions on Information Theory*, vol. IT–29, No. 2, Mar. 1983.

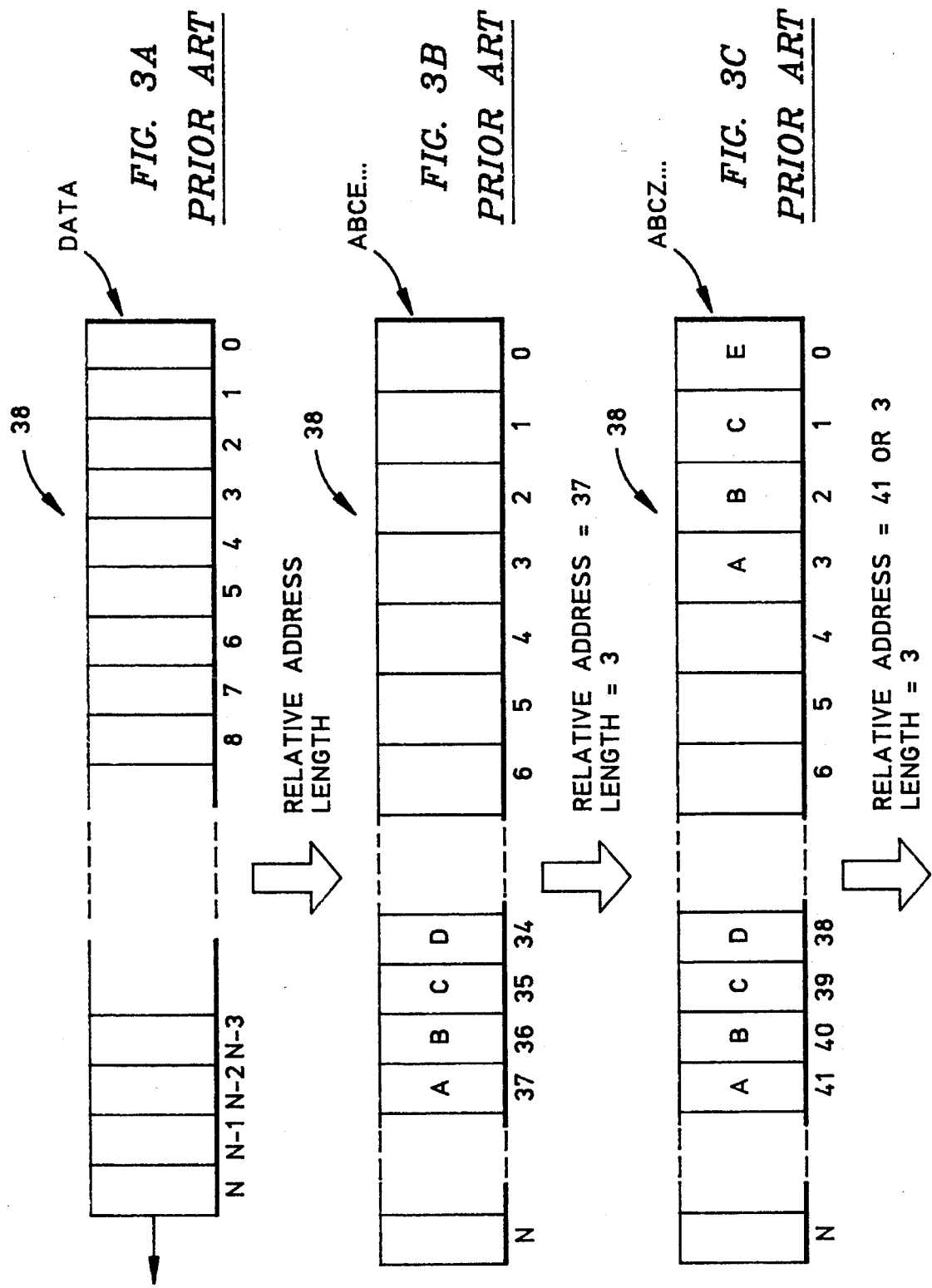

```
< K code > := bucket      bucket           length
  prefix     capacity        code  words
       0         2             2 ..  3
      10         4             4 ..  7
     110         8             8 .. 15
    1110        16            16 .. 31
   11110        32            32 .. 63
  111110        64            64 .. 127
 1111110       128           128 .. 255
11111110       256           256 .. 511
111111110      512           512 .. 1023
     ...      1024          1024 .. 2047
                ...           ........
```

*FIG. 7B*

```
< 286LZ1 > := bucket      bucket                length
  prefix     capacity              code  words
       0         2                  00 .. 01
      10         4                1000 .. 1011
     110         8              110000 .. 110111
    1110        16            11100000 .. 11101111
    1111       256        111100000000 .. 111111111111
```

*FIG. 8B*

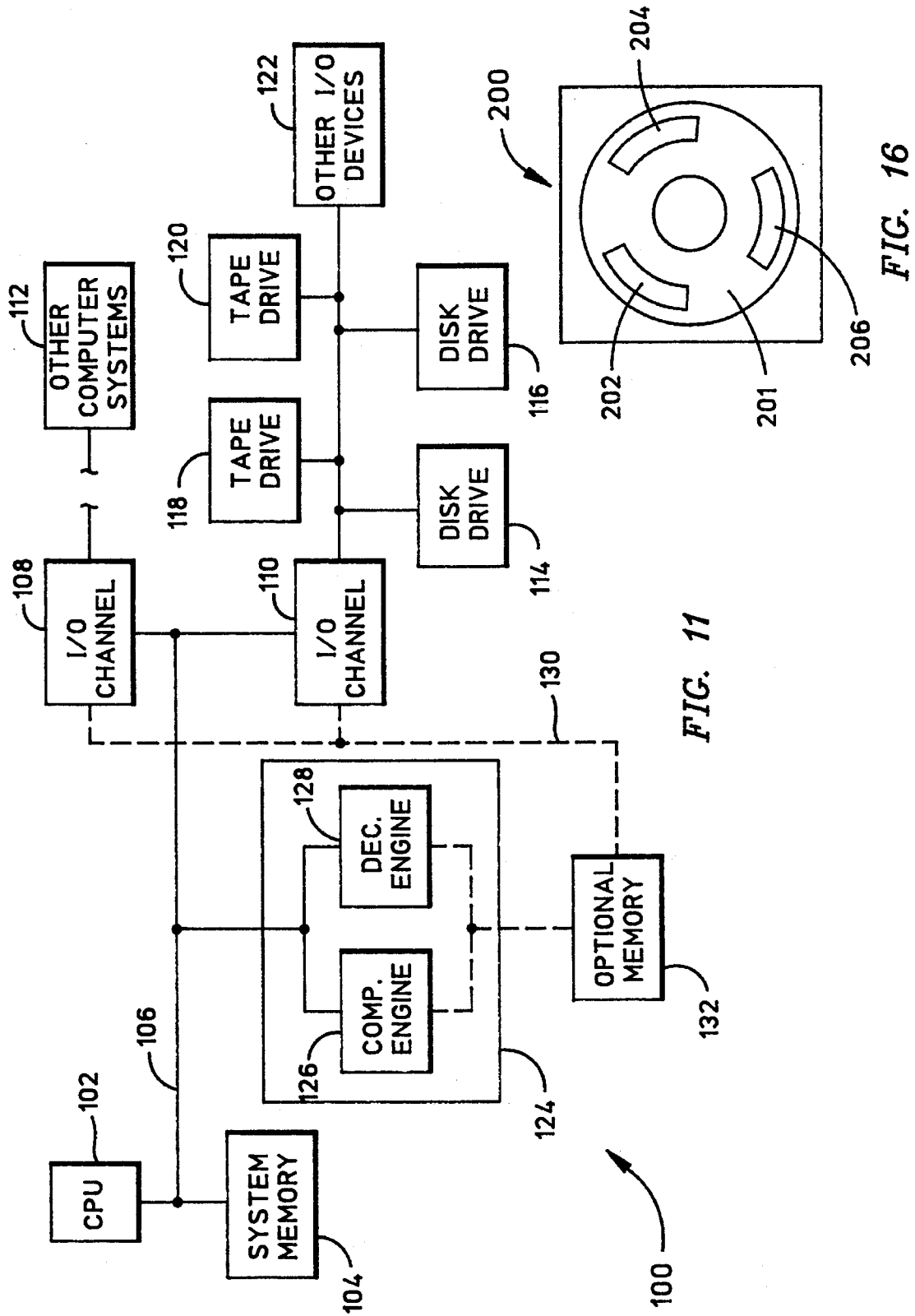

EFFICIENT ZIV-LEMPEL LZ1 DATA COMPRESSION SYSTEM USING VARIABLE CODE FIELDS

BACKGROUND OF THE INVENTION

1. Field of the Invention

This invention relates generally to adaptive dictionary-based data compression systems and specifically to an efficient Ziv-Lempel LZ1 coding procedure employing variable offset and control code fields suitable for data compression in hardware or software.

2. Description of the Related Art

With the explosive growth of demand for data transmission and storage capacity, improved data compression techniques are vigorously sought in the data processing arts. Although many different classes of data compression techniques are known in the art, one of the most useful is the class of dictionary-based universal compression techniques. Among these, the most useful today are the so-called Ziv-Lempel variable-length encoding procedures that are ascribed to J. Ziv and A. Lempel, who suggested the "length-offset" encoding scheme commonly denominated the "LZ1" data compression process in Ziv et al., "A Universal Algorithm for Sequential Data Compression", IEEE Trans. on Info. Theory, IT-23(3): 337–343, 1977). Later, Ziv et al. ("Compression of Individual Sequences via Variable Rate Coding", IEEE Trans. on Info. Theory, IT-24(5): 530–536, 1978) suggested the more popular adaptive "dictionary tree" encoding procedure commonly denominated the "LZ2" data compression process. The LZ1 process uses a fixed-size window into the past source data string as the dictionary. Matches are coded as a "match length" and an "offset" from an agreed position. LZ2 does not find matches on any byte boundary and with any length as LZ1 does but instead, when a dictionary word is matched by a source string, adds a new word to the dictionary that is the matched word plus the following source string byte. Matches are coded as pointers or indexes to the words in the dictionary. Terry A. Welch ("A Technique for High Performance Data Compression", IEEE Computer, pp. 8–19, June 1984) later refined the LZ2 process to create the popular Ziv-Lempel-Welch data compression process, commonly denominated the "LZW" process. The LZW process is also disclosed in U.S. Pat. No. 4,558,302 issued to Welch and assigned to Unisys Corporation.

The art is replete with improvements to the LZ2 and LZW data compression processes, primarily because of their relatively easy encoder implementation. For instance, Miller et al. ("Variation on a Theme by Ziv and Lempel", IBM Research Report RC10630, Jul. 31, 1984) modify and augment the LZ2 procedure to improve the compression ratio and better control the size of the encoding dictionary. These improvements are also disclosed in U.S. Pat. No. 4,814,746 issued to Miller et al. and assigned to International Business Machines Corporation. Similarly, in U.S. Pat. No. 4,464,650, Eastman et al. later disclose a LZ2 improvement related to input data stream parsing. In U.S. Pat. No. 5,087,913, Eastman later discloses additional LZ2 improvements related to dictionary building. Other LZW data compression process improvements are disclosed in U.S. Pat. Nos. 4,876,541, 5,150,119, 5,151,697 and 5,153,591, to mention a few.

The LZ2 and LZW data compression encoding procedures are easy to implement because the dictionary contents are built adaptively merely by adding a new word representing an old word extended by one new byte. Given the resulting dictionary, anyone can decode the compressed data. Disadvantages of the LZ2 process include relatively slow encode and decode speeds, a dictionary reset requirement or similar costly steps to ensure continuing adaption to long source strings with limited dictionary size, and limitations on usable match boundaries.

There apparently was less interest at first in the original LZ1 data compression process, perhaps because of encoder complexity. Interestingly, in an early U.S. Pat. No. 4,054,951, Jackson et al. disclose a "data expansion apparatus" that encodes for storage repeated data strings in a long data stream in terms of a tag, address, length and repetition count. Although the Jackson et al. patent application was filed before publication of the above-cited Ziv et al. references, the LZ1 data compression process reads on the Jackson et al. claims.

More recently, in U.S. Pat. No. 5,003,307, Whiting et al. disclose a ZV1 data compression apparatus with a shift register search means useful for implementing the difficult string-locating procedure required by the ZV1 data compression process. The Whiting et al. patent describes the basis for the 9703/9704 data compression co-processor chip produced by Stac Electronics (Robert Lutz, "9703/9704 Design Guide", Stac Electronics Application Note APP-0006, Stac Electronics, Carlsbad, Calif., July 1990) and the QIC development standard for data cartridge tape drives ("Data Compression Format for ¼-Inch Data Cartridge Tape Drives", Development Standard QIC-122, rev. B, Feb. 6, 1991, Quarter-Inch Cartridge Drive Standards, Inc., Santa Barbara, Calif.). The success of the Whiting et al. LZ1 embodiment and the continuing need for high compression and decompression speeds have stimulated recent interest in the LZ1 process.

Because LZ1 scrolls the source string over a fixed-size "history" window to create the "dictionary", identification of duplicate "matching" strings in the source data is difficult, but once done, very efficient. Matches are not necessarily limited to predictable byte boundaries and, for instance, back-to-back matches may hop around in the history window. However, once a matching string is encoded as a "length" and "offset", the necessary decoding process is rapid and efficient, requiring no dictionary preload. LZ2 and LZW decompression processes are both of similar complexity to the LZ2 compression process and seriously limited in speed by dictionary preload and reset requirements.

Reference is made to Daniel Helman ("General Purpose Data Compression ICs", *IEEE* 1991, pp. 344–348, 1991) and Kent Anderson ("Methods Of Data Compression After The Manner Of Lempel And Ziv", *Optical Information Systems*, pp. 40–43, January–February 1990) for comparative discussions of the LZ1 and LZ2 data compression processes. The important differences between LZ1 and LZ2 arise from the LZ2 restriction of the match offset to positions in the dictionary tree linked to previous matches. Although this LZ2 restriction greatly simplifies the matching encoder, it also increases storage requirements for both encoder and decoder and requires a LZ2 decoder that is substantially more complex than the equivalent LZ1 decoder. Thus, the LZ1 process is better suited to any compression system that must achieve high throughput rates in both directions.

All adaptive dictionary-based data compression processes suffer from what may be called "start-up losses" in compression efficiency. Because each source string or block begins with an empty "dictionary", the first source symbols must be passed through as raw bytes without compression. After accumulating a substantial dictionary, matches are found for increasing numbers of source sub-strings and encoded to gradually build up compression efficiency to long-term levels.

Another well-known problem with all data compression processes is the increase in potential error-correction problems resulting from loss of redundancy in the data. Because compression removes redundancy from the source symbol stream, the compressed output data stream is quite vulnerable to data corruption arising from bit errors that cannot be corrected because of the lack of redundancy necessary for such correction.

Accordingly, there is a clearly-felt need in the art for a data compression system that provides the high throughput of an LZ1 process with improved compression efficiency and very high reliability. The related unresolved problems and deficiencies are clearly felt in the art and are solved by this invention in the manner described below.

SUMMARY OF THE INVENTION

The data compression system of this invention substantially increases LZ1 compression efficiency and retains the simple LZ1 decoding procedure by making several basic improvements to the well-known LZ1 data compression process. These improvements include (a) providing a variable-length match "offset" token field during the start-up and filling of the history buffer, (b) limiting the number of available match "length" token codes to improve latency by reducing the code book size, and (c) distributing match "length" token codes to prefix buckets grouped to exploit the change from Laplacian to uniform match-length probability distributions at higher match-length values. Reducing the number of match "length" codes makes several unused prefix code slots available for assignment as "control" codes, thereby permitting insertion of interleaved "control" codes in compressed data streams without slowing or interrupting either encoder or decoder.

An object of this invention is to provide improved data compression efficiency in a LZ1 data compression embodiment. An advantage of the system of this invention is that data compression efficiency is improved over other LZ1 embodiments known in the art.

Another object of this invention is to provide a scheme suitable for parallel processing to achieve high compression and decompression data throughput rates. A feature of the system of this invention, which can be implemented in hardware for increased speed, is that it offers the high throughput rates known for the LZ1 data compression and decompression processes. The system of this invention can be implemented using parallel processing with pipelining in hardware to compress or decompress one source symbol (byte) per system clock cycle.

Yet another object of this invention is to provide data compression and decompression without significant system overhead or latency. An advantage of the system of this invention is that no dictionary preload or reset operations are needed and "control" codes can be embedded in the compressed data stream for error correction and other purposes without interrupting the dictionary encode/decode process.

Another object of this invention is to provide very high data reliability and avoid all uncorrectable errors. An advantage of the system of this invention is that latency is such as to permit simultaneous decoding of compressed output code during compression so that a CRC comparison between decompressed code and original data can immediately detect output code string errors on the fly during data compression.

A feature of the system of this invention is that any necessary CRC correction codes can be generated and inserted in an output code stream as "command" codes containing any information necessary to correct compression errors on the fly without slowing or interrupting the process.

The foregoing, together with other objects, features and advantages of this invention, can be better appreciated with reference to the following specification, claims and the accompanying drawing.

BRIEF DESCRIPTION OF THE DRAWING

For a more complete understanding of this invention, reference is now made to the following detailed description of the embodiments as illustrated in the accompanying drawing, wherein:

FIGS. 3A–3C are functional block diagrams of a history buffer illustrating a data compression example from the prior art;

FIGS. 7A–7B show the tree and tabular forms of a Karnin code for the match "length" and "control" code fields of FIG. 6;

FIGS. 8A–8B show the tree and tabular forms of a reduced 286LZ1 code for the match "length" and "control" code fields of FIG. 6;

FIG. 11 is a functional block diagram of an exemplary data storage system incorporating the data compression system of this invention;

FIG. 16 is a schematic diagram of a computer program product according to this invention.

DETAILED DESCRIPTION OF THE PREFERRED EMBODIMENTS

The LZ1 Data Compression Procedure

Reference is made to a co-pending patent application number 07/807,007 and 08/290451, and 08/537,769 entitled "Method and Apparatus for Compressing Data" filed on Dec. 13, 1991, assigned to the assignee hereof, and wholly incorporated herein by this reference, for a description of a LZ1 encoder employing a content addressable memory (CAM) for rapid identification of matching sub-strings in the past source symbol stream.

Figure 1:
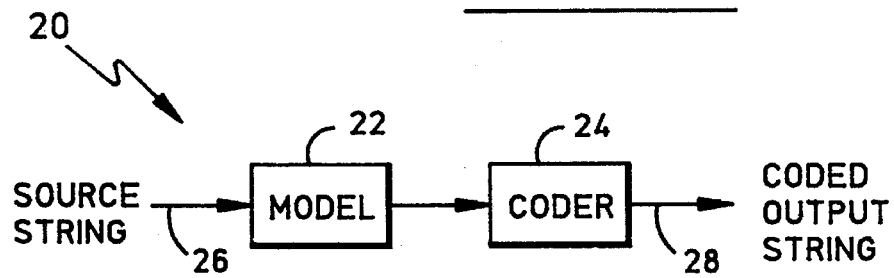
FIG. 1 is a functional block diagram of the fundamental data compression system model from the prior art.

FIG. 1 illustrates a generic data compression system 20 known in the art to include a decorrelation modeling unit 22 coupled to an entropy coding unit 24. The source symbol string 26 is presented to modeling unit 22, which ideally operates to remove all correlation in the source data stream. The results of this decorrelation modeling are presented to coding unit 24, which assigns a code length to each decorrelated symbol according to an assumption of symbol probability distribution to produce the coded output stream 28. That is, modeling unit 22 ideally removes correlation from the source string and coding unit 24 ideally minimizes entropy (by minimizing the average number of bits per code symbol) in the output string.

Figure 2:
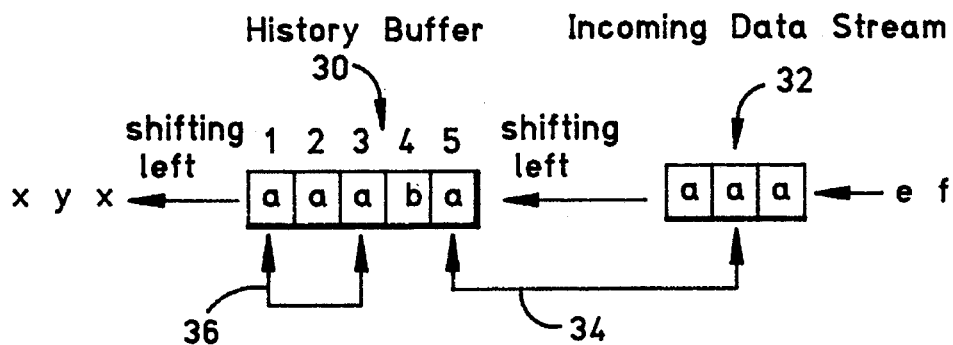
FIG. 2 is a functional block diagram of a history buffer illustrating a pattern matching example from the prior art.

The LZ1 modeling procedure replaces a redundant substring of source symbols with a pointer to an earlier occurrence of the same sub-string in the input source symbol string. Data compression occurs when the pointer representation is coded to fewer bits than the replaced source symbol sub-string. Higher compression is possible when the input data string includes many sub-string repetitions (more redundancy). The original LZ1 scheme uses the history buffer of $L_B$ byte capacity and a look-ahead buffer of length $L_L$. FIG. 2 shows a history buffer 30 with $L_B$=5 bytes of capacity and a look-ahead buffer 32 with $L_L$=3 bytes of capacity. The first encoder task is to find the longest prefix of the 3-byte string in buffer 32 that has an exact match in buffer 30. The length of this longest match is denoted $L_M$ bytes and the position or "offset" in buffer 30 where the match is located is denoted as $L_O$ bytes counted from some useful starting point in buffer 30, perhaps the input byte. In FIG. 2, the source string "xyxaaabaaaaef" is shown in transit through buffers 30 and 32. With the buffer contents shown, the encoder match detector finds a match for "aaa" in buffer 32 at two different offsets. The first match 34 is found at offset 5 and the second match 36 is found at offset 1. Thus, in the simple example shown in FIG. 3, the 3-byte content of buffer 32, which may occupy 24-bits in ASCII format, may be replaced with a token [flag, length, offset] having either of the values of [1, 3, 5] or [1, 3, 1]. The "flag" bit is required to distinguish between encoded output and "raw symbol" output. Although this example is described for the most common case where symbols are represented by 8-bit bytes, the general LZ1 process can be used for any finite source alphabet. When no matching symbol is found in buffer 30 or when the matching length $L_M$=1, it may be more efficient to simply pass the original source symbol through without encoding. This is usually handled by setting the "flag" to zero to denote raw byte data and setting it to unity to denote encoded tokens.

FIGS. 3A–3C provide a second example of LZ1 encoding from the prior art. A $L_B$=N-Byte history buffer 38 is shown in FIG. 3A with no data contents. In FIG. 3B, an input sequence "ABCE" is tested for matching sub-strings in buffer 38 and the $L_M$=3-Byte sub-string "ABC" is found at offset $L_O$=37. In FIG. 3C, the next four source symbols "ABCZ" are tested for matching sub-strings in buffer 38 and two different $L_M$=3-Byte matching sub-strings are found; one at offset $L_O$=3 and another at $L_O$=41. Both matching sub-strings have length $L_M$=3, although the lengths may not be identical in such situations. Practitioners skilled in the art appreciate that the encoded token having the fewest number of bits should be selected from among the two available tokens in FIG. 3C. Depending on the "offset" coding specification used, the offset of "3" may be shorter than the other available offset of "41" for instance.

The heart of the LZ1 encoding scheme is the matching of the current sub-string to its longest prefix available within the history buffer. This function requires most of the encoding time and should be made as efficient as possible, and the coding improvements of this invention are designed to have no effect on decorrelation efficiency. The location of matching sub-strings in the history buffer operates to remove redundancy from (decorrelate) the input source symbol string, which is the purpose of modeling unit 22 discussed above in connection with FIG. 1. Once a match token is identified for a sub-string, the token itself is then encoded to minimize entropy (maximize the information per bit) in the output code symbol string. This is the purpose of coding unit 24 (FIG. 1) and is conceptually distinct from the elimination of redundancy.

This invention is primarily concerned with improving the function of coding unit 24. The above-cited Whiting et al. and the above-incorporated 07/807007 and 08/537769 reference provide two useful methods for decorrelating the symbol stream preparatory to encoding according to this invention. The above-incorporated 07/807007/08/537769 reference describes a preferred content-addressable memory (CAM) technique that is particularly advantageous in this regard.

The industrial data compression standard, denominated the QIC-122 development standard, is fully described in the above-cited Lutz reference. The QIC-122 standard is widely-used in the art and includes "Huffman" code specifications for encoding the match length and offset tokens. A QIC-122 data compression example is now described.

Table 1 summarizes the QIC-122 data compression encoding format specification known in the art.

TABLE 1

```
<Compressed_Stream>   := [<Compressed_String>]  <End_Marker>
<Compressed_String>   := 0  <Raw_Byte>  |  1  <Compressed_Bytes>
<Raw_Byte>    := <b><b><b><b><b><b><b><b>      ( 8-bit byte )
<Compressed_Bytes>  := <Offset>  <Length>
<Offset>    := 1 <b><b><b><b><b><b><b>      ( 7-bit offset )
             |  0 <b><b><b><b><b><b><b><b><b><b><b>    (11-bit)
<End_Marker>  :=  110000000    (offset = 0)
<b>   :=  0 | 1
<Length>    := 00                    ( = 2 bytes)
             |  01                   ( = 3 bytes)
```

TABLE 1-continued

|   |    |    |      |      |      |              |
|---|----|----|------|------|------|--------------|
|   | 10 |    |      |      |      | ( = 4 bytes) |
|   | 11 | 00 |      |      |      | ( = 5 bytes) |
|   | 11 | 01 |      |      |      | ( = 6 bytes) |
|   | 11 | 10 |      |      |      | ( = 7 bytes) |
|   | 11 | 11 | 0000 |      |      | ( = 8 bytes) |
|   | 11 | 11 | 0001 |      |      | ( = 9 bytes) |
|   | 11 | 11 | 0010 |      |      | ( = 10 bytes) |
|   | 11 | 11 | 0011 |      |      | ( = 11 bytes) |
|   | 11 | 11 | 0100 |      |      | ( = 12 bytes) |
|   | 11 | 11 | 0101 |      |      | ( = 13 bytes) |
|   | 11 | 11 | 0110 |      |      | ( = 14 bytes) |
|   | 11 | 11 | 0111 |      |      | ( = 15 bytes) |
|   | 11 | 11 | 1000 |      |      | ( = 16 bytes) |
|   | 11 | 11 | 1001 |      |      | ( = 17 bytes) |
|   | 11 | 11 | 1010 |      |      | ( = 18 bytes) |
|   | 11 | 11 | 1011 |      |      | ( = 19 bytes) |
|   | 11 | 11 | 1100 |      |      | ( = 20 bytes) |
|   | 11 | 11 | 1101 |      |      | ( = 21 bytes) |
|   | 11 | 11 | 1110 |      |      | ( = 22 bytes) |
|   | 11 | 11 | 1111 | 0000 |      | ( = 23 bytes) |
|   | 11 | 11 | 1111 | 0001 |      | ( = 24 bytes) |
|   | 11 | 11 | 1111 | 0010 |      | ( = 25 bytes) |
|   |    |    | ...  |      |      |              |
|   | 11 | 11 | 1111 | 1110 |      | ( = 37 bytes) |
|   | 11 | 11 | 1111 | 1111 | 0000 | ( = 38 bytes) |
|   | 11 | 11 | 1111 | 1111 | 0001 | ( = 39 bytes) |
|   |    |    | etc. |      |      |              |

Note that Table 1 describes a data encoding specification for reducing entropy and does not specify the decorrelation process for removing redundancy from a data stream. The format is designed to support any useful adaptive string decorrelation process that can find redundant strings in an uncompressed data stream and replace them with shorter tokens. The token stream represents the original information with redundancy removed. The formal notation used in Table 1 and elsewhere herein is well-known in the art but is now repeated for clarity.

| Symbol | Description |
|--------|-------------|
| := | the non-terminal expression on the left side of ":=" may be replaced by the expression on the right side. |
| <name> | a non-terminal expression. |
| [] | the expression inside "[]" may occur zero or more times. |
| \| | the disjunctive or exclusive "OR". |
| () | the text inside "()" is a comment provided for clarity. |
| 0,1 | the terminal binary digits 0 or 1. |

Note that the encoded output bits in Table 1 are transferred in the output data stream and stored from the most significant bit to the least significant bit. To decompress a string, the following algorithm is used:

```
for (i=0; i<length; i++, hptr++)
    history [hptr] = history [(hptr - offset) &2047];
``` where hptr is the current history buffer pointer.

Figure 4:
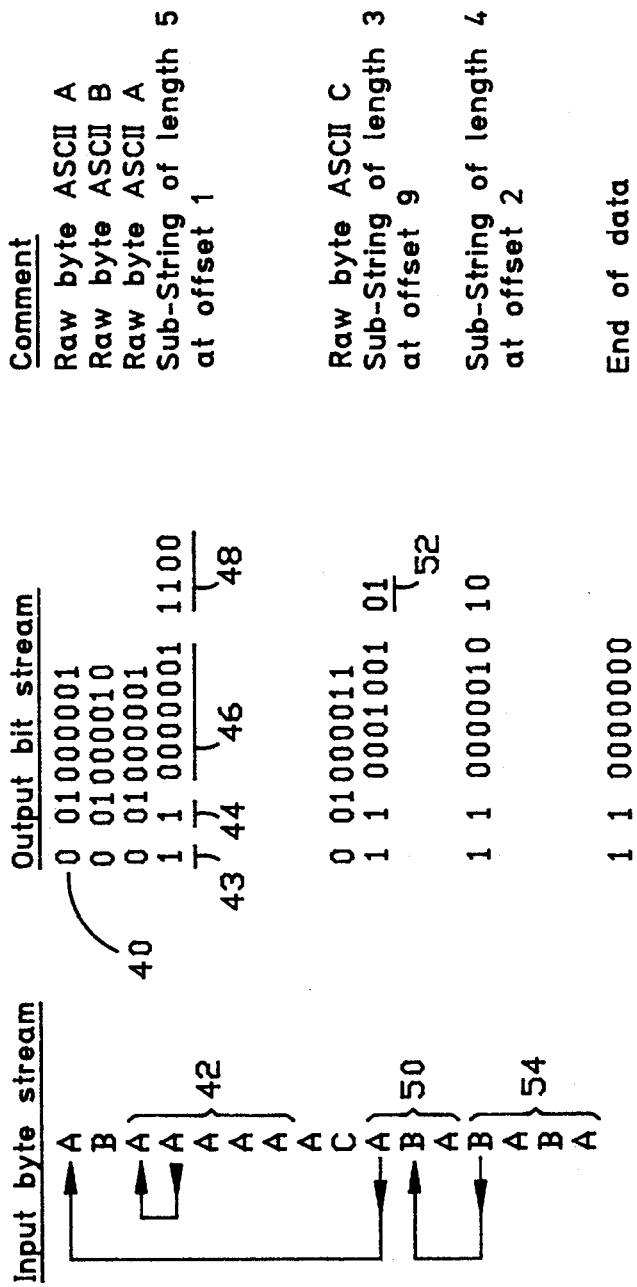
FIG. 4 is a chart showing a LZ1 encoding example from the prior art.

FIG. 4 illustrates a simple encoding example using the QIC-122 encoding specification from Table 1. The exemplary source symbol string in FIG. 4 is "ABAAAAAACABABABA", which in uncompressed ASCII form, requires 16 8-bit bytes or a total of 128 bits. The output bit stream begins with a zero-valued flag bit 40 followed by the 8-bit ASCII code for "A", which is passed through as a raw byte because the history buffer is empty. A similar raw byte pass-through occurs for the second and third source symbols. Each such raw byte requires 12.5% additional bits because of the added "raw byte" flag bit exemplified by bit 40, which is known in the art as "data expansion".

A matching sub-string 42 is found for the $4^{th}$-$8^{th}$ source bytes. Matching sub-string 42 has a length of 5 and an offset of 1. The output code begins with a flag bit 42 that is set to 1 to indicate that a coded token follows. Next, an offset flag bit 44 is set to 1 to show that the subsequent offset field is 7 bits long. Next, follows the offset field 46, which is set to $L_O$=1, and a match length field 48, which is the Huffman code specified for a 5-Byte match length.

When the first occurrence of source symbol C arrives, it is passed through as a raw byte because no other "C" is found in the history buffer. However, the subsequent "ABA" source symbol sub-string is matched to a 3-byte sub-string located at offset 9 (9 bytes earlier). Note that the Huffman code 50 for a 3-byte match length requires only two bits.

The last four source symbols "BABA" are matched to a 4-byte sub-string located at an offset of two bytes. Finally, the block is ended with an "offset=0" code. Note that the output bit stream requires only ten 8-bit bytes to express the information contained in the 16-Byte input stream. Also, note that the output stream is transferred from most significant half-byte to least, as shown by the hexadecimal values in FIG. 4.

The QIC-122 standard specifies the history buffer size to be $L_B$=2048 bytes and uses an unlimited look-ahead buffer length, which means that any match sub-string to be encoded may be as long as the remaining input string. A compressed code string may be decompressed using a simple decoder without any knowledge of the decorrelation dictionary.

The "Fast Attack" Variable-Length Offset Coding Improvement

The process of this invention for the first time adds a "fast attack" data encoding process to reduce the number of bits in the "offset" field of the coded data token during the start-up interval when the history buffer is only partially filled. To appreciate the need for the fast attack process, consider the offset field definition in Table 1. Either 7 or 11 bits are always produced, even during the start-up interval when much fewer than $2^7$ or $2^{11}$ bytes are occupied in the history buffer. The fast attack process calculates the offset field size minimally necessary to span the address space of $L_H$ bytes stored in the history buffer during the period when $1 \leq L_H < L_B$, where $L_H$ represents the total number of source symbol bytes received in the current data block and $L_B$ represents the history buffer capacity. Table 2 gives a preferred pseudocode embodiment of the process required to code the variable-length offset token is presented in Table 2. the "occupied" portion of the history buffer. Of course, the decoding process of this invention must be able to calculate and parse the number of bits devoted to the offset token. Table 3 gives a preferred pseudocode embodiment of the process for decoding the "fast attack".

TABLE 2

```
/* ********************************************************************** */
/*                    Code_Offset (unsigned int )                          */
/*     Code the offset token. Determine not only the value, but also       */
/*     the number of bits to write out.                                    */
/*             A sub-string match has been determined and ptr is the offset */
/*             in the history buffer where the sub-string starts.          */
/*             This objects private attribute keeps track of how many bytes */
/*             have been written in the bytes_written variable. Once       */
/*             the number of bytes written exceeds the history buffer      */
/*             size, then the history buffer is full and the number        */
/*             of bits written is always the number of maximum bits; ie.   */
/*             log2(history_buffer_size) which is equal to                 */
/*             history_expo.                                               */
/*     The number of bits written depends on the number of bytes written   */
/*     in the history buffer.                                              */
/*                                                                         */
/* ********************************************************************** */
Token Compress::Code_Offset(unsigned int ptr)
{
    Token x;               /* Create a token with a value and length.
                              The length is the number of bits to
                              write out.                                    */
    x.value = ptr;         /* ptr is the offset of the sub-string.         */
    if (!full)             /* Has the entire history buffer been
                              written?                                      */
                           /* No, so use only as many bits as needed.       */
        if(bytes_written)  /* Can't take log of zero.                       */
            x.length = (int) (log(bytes_written)/log(2))+1;
                           /* Watch the round-off errors.                  */
        else
            x.length = 1;
    else
        x.length = history_expo;   /* CAM is full, so use maximum number of
                                      bits.                                 */
    return x;              /* Now return the token to be written
                              out.                                          */
}
```

Note that the "x.length" value of the offset field is rounded up to the next higher integer above $1+\log_2 L_H$, which ensures that the offset field is sufficient to span the address space of

TABLE 3

```
/* ********************************************************************** */
/*     Get a token from the bits Stream; ie. Get the length and displacement. */
/*     Return false if the token is invalid. Note: TextBit is a member     */
/*     function that returns true if the next bit in the stream is a '1'.  */
/* ********************************************************************** */
bool Decode::GetToken(Token *z)
{
    /*  Read in the Length First.                                          */
    .
    .
    .
    /*  Now Read in the displacement.                                      */
    if (!full)             /* Has the entire history buffer been read?     */
    {
        if(bytes_read)     /* Can't take the log of zero.                  */
            max_bits = (int) (log(bytes_read)/log(2))+1;
        else
            max_bits = 1;
    }
    else
        max_bits = history_expo;   /* CAM is full so use the maximum number
                                      of bits.                             */
```

TABLE 3-continued

```
    for (i = 0; i < max_bits; ++i)    /*    Now read in the correct
                                            displacement.                    */
        {
        z–>value<<=1;
        if (TestBit())
            z–>value |= 1;
        }
return true;
}
```

Basically, the process in Table 3 reverses the calculation by using the number $L_H$ of bytes decoded since the beginning of the block to calculate the offset field length. Thus, the fast attack variable-length offset coding improvement of this invention limits the offset code field length to that minimally necessary to address the occupied portion of the history buffer. The data compression efficiency of the fast attack offset field improvement is significantly better for shorter data block lengths in both small and large history buffers. The best compression efficiency does not depend on the data block size but rather only on the history buffer length. The additional logical complexity of keeping track of the number of bits used in encoding the offset and decoding the offset is more than overcome by the improved data compression efficiency.

Figure 5:
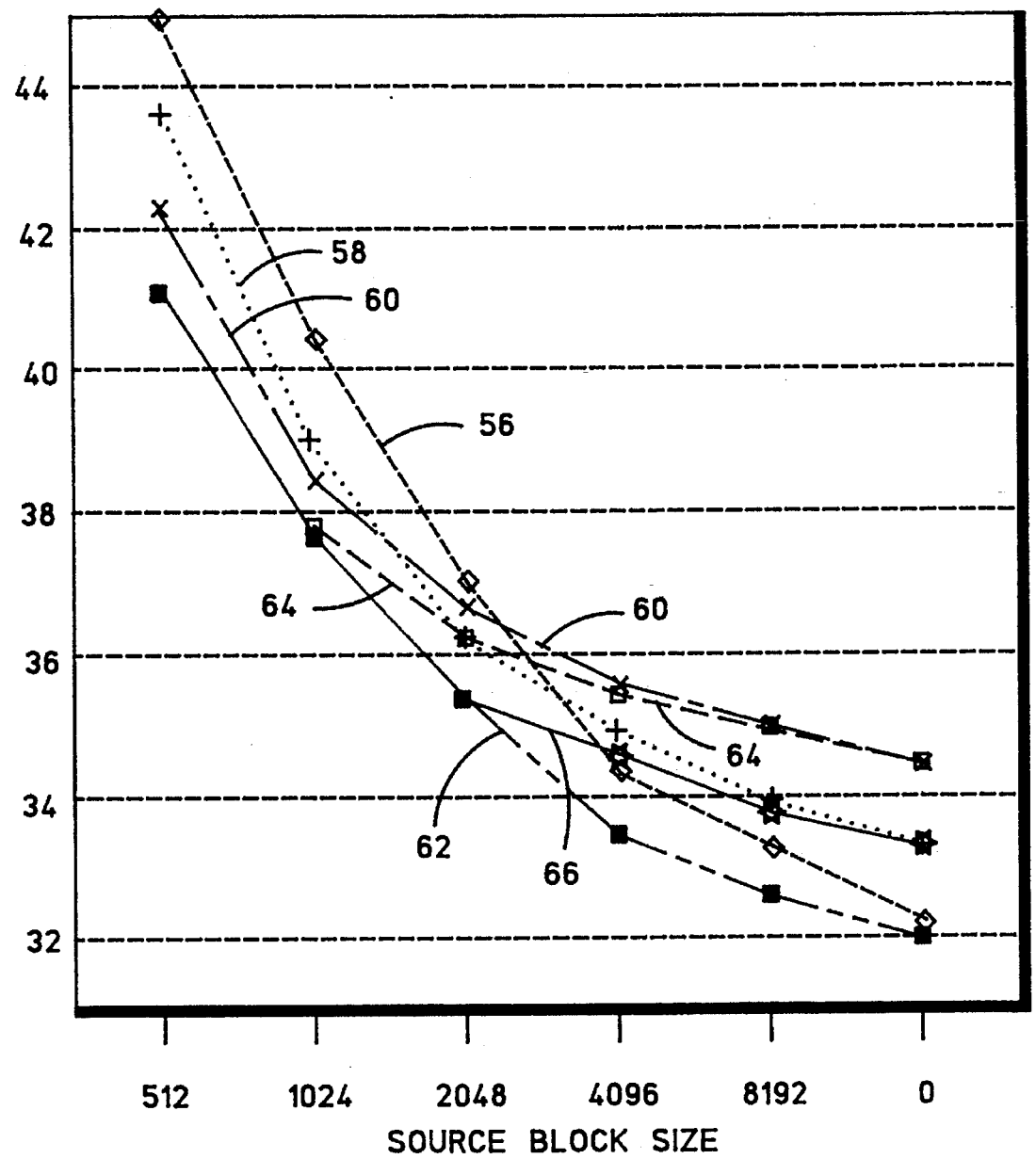
FIG. 5 is a chart showing the absolute data compression efficiency of the LZ1 process of this invention as a function of source data block length for several different history buffer sizes.

The inventors have conducted experiments to evaluate the improved compression performance on test cases. Although the test cases were derived from data commonly stored on disk drives, the compression improvement also benefits any relatively short stream of data such as data transmitted from a terminal. FIG. 5 shows a graph of the average compression of 38 test cases used in evaluating compression procedures. The compression efficiency is scaled on the ordinate as a percentage of the initial input string size. Three different history buffer lengths were tested, both with and without the fast attack offset field improvement. Each of these tests was conducted for one of several different source block sizes and the resulting compression ratio is charted against source block size. The curve 56 shows the result for the largest 2048-Byte history buffer without fast attack. The curve 58 shows the result for a 1024-Byte history buffer without fast attack and the curve 60 shows the result for the smallest 512-Byte history buffer without fast attack. The curve 62 shows the results for the largest 2048-Byte history buffer with fast attack, curve 64 shows the results with fast attack using 1024-Byte history buffer and curve 66 shows the results for the smallest 512-Byte history buffer with fast attack. Note that fast-attack curves 62, 64 and 66 overlap for block sizes smaller than 2048 bytes. As expected, the best compression ratios are obtained with the longest history buffer (curves 56 and 62) and this is consistent for all block sizes when using the fast attack improvement of this invention.

Compression efficiency without fast attack using a 512-Byte history buffer (curve 60) shows a compression ratio of about 42% when the source symbols are broken into 512-Byte blocks. The 2048-Byte history buffer (curve 56) provides about 45% compression with 512-Byte blocks but, using 8192-Byte blocks, the longer history buffer on curve 56 compresses to about 33% compared with the less useful 35% compression shown with the smaller history buffer on curve 60. By adding the fast attack improvement, the compression ratios are reduced overall to 41% with 512-Byte blocks and down to 32% for the larger blocks with the larger history buffer.

Figure 6:
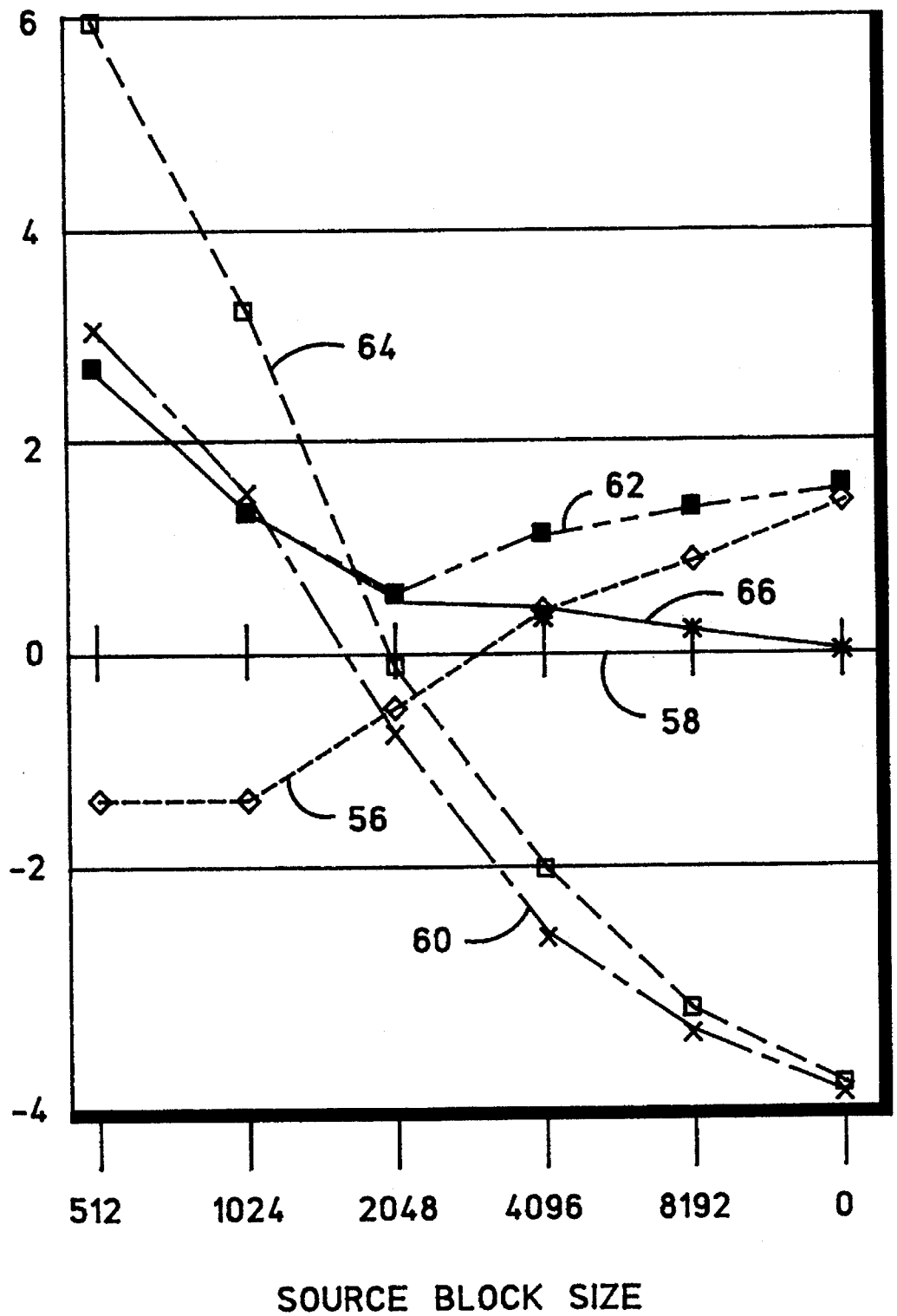
FIG. 6 is a chart showing the relative data compression efficiency of the LZ1 process of this invention as a function of source data block length for several different history buffer sizes.

FIG. 6 is a graph of the compression efficiency scaled relative to a 1024-Byte history buffer length. Thus, curve 58, representing the compression ratio achieved with a 1024-Byte history buffer, is shown as a flat line at ordinate value zero. The remaining curves are labelled with the numerals defined above for FIG. 5 to indicate the corresponding history buffer length and fast attack status. Thus, for instance, the results for a 2048-Byte history buffer with fast attack is again labelled as curve 62. The graph in FIG. 6 demonstrates that the best compression ratios are achieved using the largest history buffers. It also better shows the cross-over points for compression ratio versus source block size relative to the 1024-Byte history buffer performance. Note that even with fast attack, the shorter 512-Byte history buffer (curve 64) improves compression relative to 1024-Byte buffer curve 58 only for block sizes below 2048 bytes, and shows rapid decline of relative compression efficiency for larger block sizes.

The Match Length Coding Improvement

Certain aspects of the process of this invention arise from two unexpectedly advantageous observations. First, the inventors observed that the match length probability distribution function unexpectedly crosses over from a Laplacian probability distribution below about T=27 bytes to a uniform probability distribution above this crossover T. The exact crossover T value may vary in a narrow range depending on data type but such a crossover appears to exist for all data types. Secondly, the inventors observed that reducing the match length limit from 2048 to 192 bytes unexpectedly reduced data compression efficiency only by 0.5%. That is, eliminating the 1856 match length codes (90%) above 192 bytes costs only 0.5% in compression ratio.

The first observation leads to the simpler code book of this invention, which uses prefix bins below 30 bytes to approximate the Laplacian distribution below T=27 and a single prefix bin for all other uniformly distributed values. The second observation leads to the smaller code book of this invention, which simplifies the encoding and decoding process and reduces latency. The resulting short latency code is an improvement more desirable than the slight 0.5% loss in compression ratio. The inventors herein denominate the improved code as the "286LZ1" code, which includes 286 match-length code values in 5 buckets.

Figures 7A, 8A:
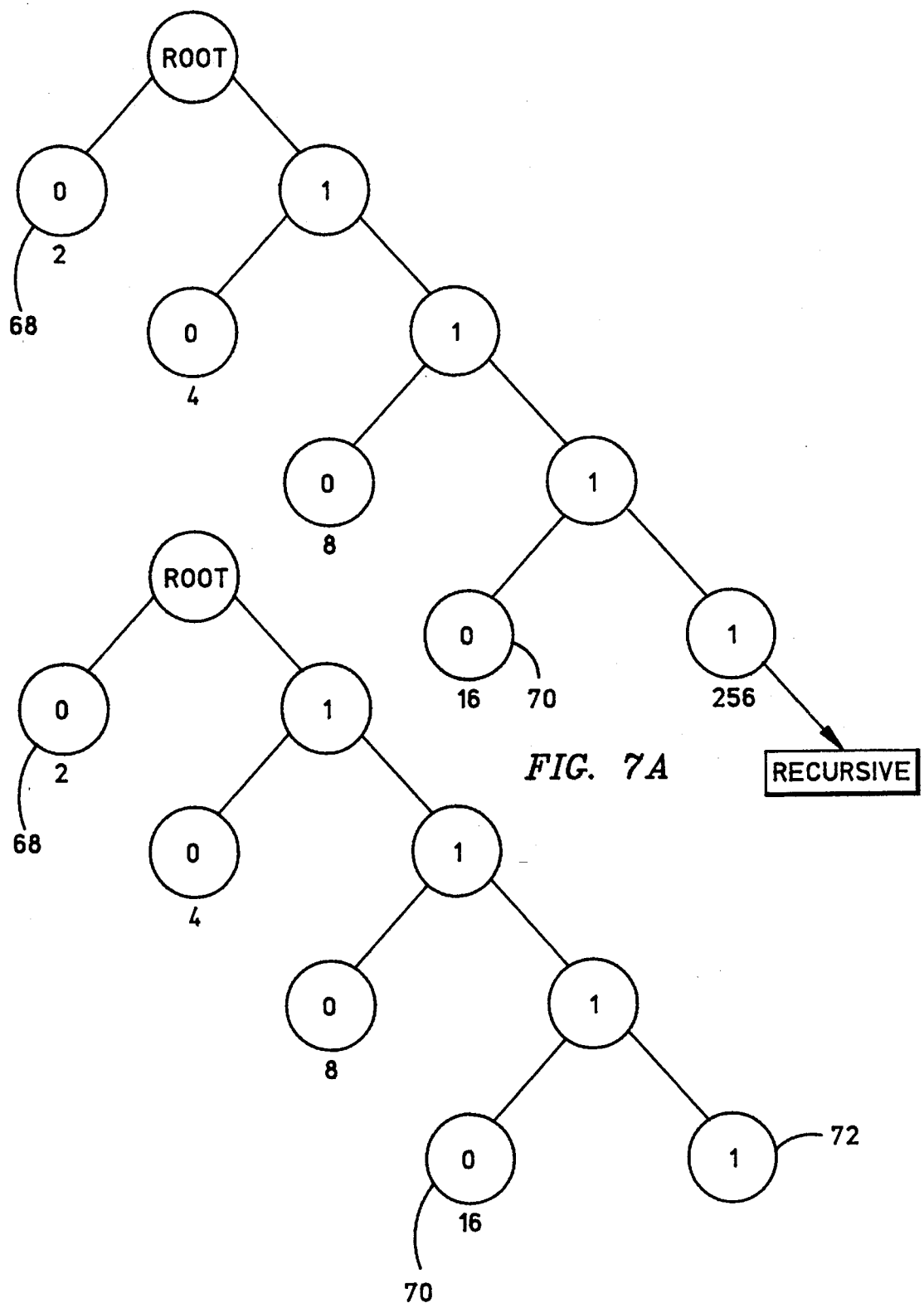

FIG. 7A shows a useful Karnin code for a LZ1 match-length token. The leaf nodes represent buckets having the prefix bits determined by a traverse through the tree from the root node. Thus, for instance, the bucket 68 contains two codes each having a "0" prefix. These codes are "00" and "01", as may be appreciated with reference to FIG. 7B. Similarly, bucket 70 contains 16 codes each having a "1110" prefix. Of course, each code in bucket 70 includes 4 bits for the fixed prefix and another 4 bits to span the 16-code address space of the bucket. The short codes in bucket 68 are assigned to short match lengths and the longer codes in bucket 70 are assigned to correspondingly longer match lengths. This encoding scheme optimizes entropy when shorter match lengths are more common than longer ones and the length increases from bucket to bucket are proportional to the declining probability.

The process of this invention for the first time recognizes the existence of a crossover point in match-length probability distribution from Laplacian to uniform. Experiments by the inventors show this crossover point to occur at about 26 to 28 bytes. Because match lengths above 28 bytes occur with uniform probability, there is no entropy improvement available from dividing the group of uniformly-probable codes into buckets of varying length. Accordingly, in addition to the usual buckets 68 and 70, the coding process of this invention has a single large bucket 72 with a fixed prefix of "1111" and the additional 8 bits needed to span 256 code values. The code assignments for FIG. 8A may be appreciated with reference to the table in FIG. 8B.

Note that the coding assignments in FIG. 8B are sufficient to encode 286 different match lengths with a maximum of 12 bits in the last bucket. FIG. 7B shows that a total of 8 buckets of code words are required to span 286 match lengths with 16 bits in the last bucket. The difference between the 12-bit code word maximum of this invention and the 16-bit code word length required in the Karnin code of FIGS. 7A–7B is sufficient to improve coding efficiency by more than the 0.5% lost by limiting the number of match lengths to less than 286. This result arises from the unexpectedly advantageous observation that match length probability distribution changes character from Laplacian to uniform at some point below 30 bytes.

Because the total number of match lengths in the code book of this invention is limited to less than 286 (192 is sufficient), several of the code words in bucket 72 (FIG. 8A) are available for use as "control" codes according to another aspect of this invention. As compression removes redundancy in the source symbol stream, the coded output data stream becomes very vulnerable to data corruption. A single bit error in the output stream could lead to complete failure in decoding the compressed data. This invention overcomes the potential error-correction problem by incorporating extremely high reliability requirements, on the order of one undetected error in $10^{30}$.

Figure 9:
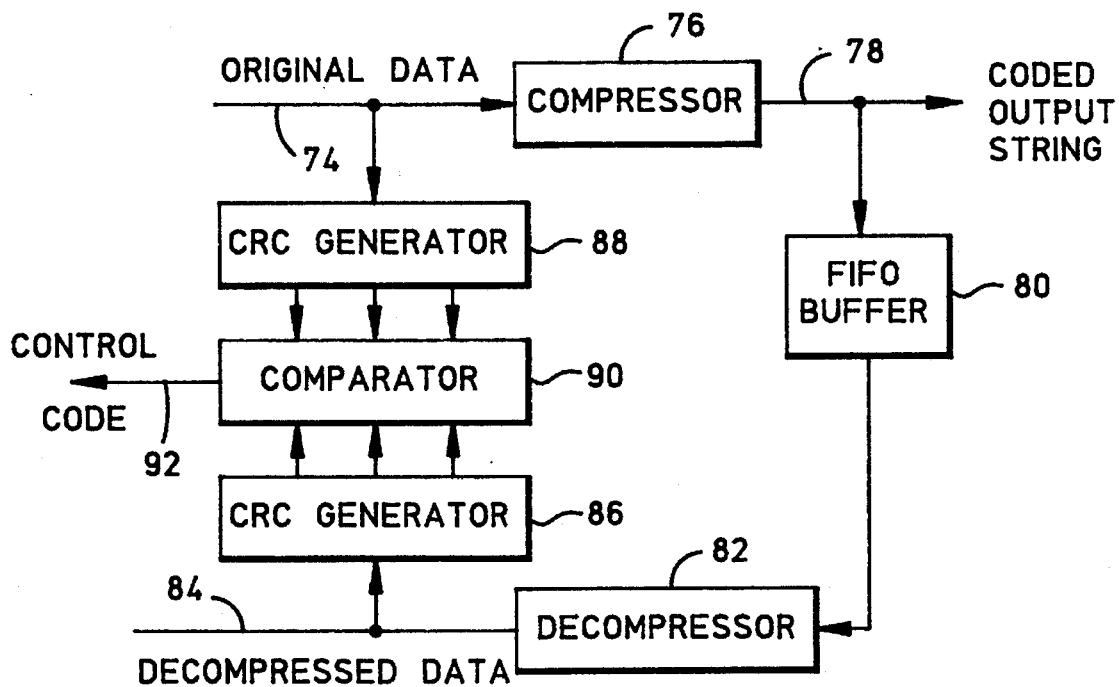
FIG. 9 is a functional block diagram showing the coded string decompression and CRC comparison process of this invention for ensuring data reliability.

FIG. 9 shows a functional block diagram of an exemplary embodiment of the system of this invention for ensuring coded data reliability. The original data stream 74 is presented to a compressor 76, which compresses the data in accordance with the process of this invention to produce coded output string 78. During this process, a first-in-first-out (FIFO) buffer 80 temporarily stores the coded output string 78 and makes it available to a decompressor 82. Decompressor 82, using the decompression method of this invention, produces a decompressed data stream 84. Decompressed source data stream 84 is presented to a cyclic-redundancy-code (CRC) generator 86 and original source data stream 74 is presented to an identical CRC generator 88. A comparator 90 accepts the CRCs from generators 86 and 88, which should be identical when properly synchronized to account for buffer delays (synchronizing functions not shown). According to one aspect of this invention, comparator 90 produces a control code 92 responsive to any indication of error in decompressed source data stream 84. Control code 92 can be inserted into coded output string 78 for use in correcting data errors detected by comparator 90 or for any other purpose such as to interrupt and re-execute compression of the suspect block.

Figure 10:
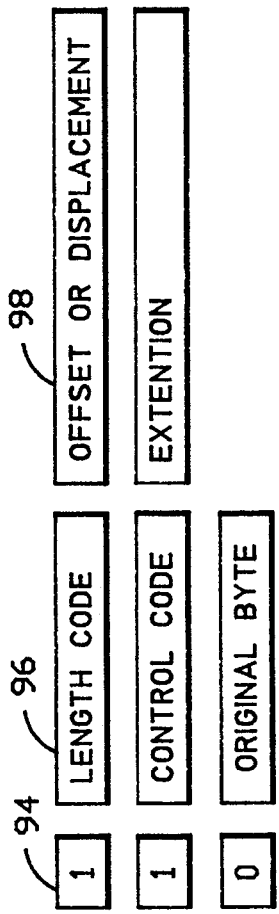
FIG. 10 shows the 286LZ1 encoding format of this invention.

FIG. 10 shows the 286LZ1 encoding format of this invention. For example, a flag field 94 is followed by a code field 96, which may be followed by an extension field 98. When the flag field is set to "0", the original source byte is presented in code field 96 and no extension field is expected. When the flag field is set to "1", the code field may include either a match-length code or a control code, depending on the code assignments described below in Tables 4 and 5. If field 96 includes a match-length code, field 98 always includes the corresponding offset code necessary to complete the length-offset definition of the replaced source byte sub-string. If field 96 includes a control code, then field 98 may include an extension or may not, depending on whether the control field code is a "long-control" or a "short-control", according to the control code assignments described below in Table 5.

The compression-decompression pair in FIG. 9 presents certain system constraints. Compressor 76 may not produce any code word for a substantial latency time during a highly-compressible stream. The maximal compression latency is the number of original bytes that compressor 76 accepts before it emits a first code word in stream 78. At peak compression, decompressor 82 is running behind by a maximum latency, which implies that FIFO buffer 80 must be sized to hold at least the maximum latency times the data expansion factor (112.5%) for the raw byte format. These considerations demonstrate the advantages of minimizing latency by limiting match length dictionary size in accordance with this invention.

Referring to FIG. 8B, although this coding assignment is preferred, practitioners skilled in the art can appreciate that there are many other possible code assignments that satisfy the Laplacian-uniform probability distribution feature discovered by the inventors. For example, one useful assignment is simply to use four buckets of 2, 4, 8 and 16 without using any uniform random distribution bucket, leading to a total of 30 possible code words. Another useful assignment is to use five buckets of 2, 4, 8, 16 and 32 to provide a total of 62 possible code words with an advantageously short latency. Table 4 below provides the preferred embodiment of the 286LZ1 encoding format specification of this invention.

TABLE 4

```
<Compressed_Stream>    :=  <Compressed_String><End_Marker>
<Compressed_String>    :=  <Raw_Tag><Raw_Byte>
                        |  <Compress_Tag><Compressed_Bytes>
                        |  <Control>
<Raw_Tag> := at least one bit; for example <Raw_Tag> := 0
<Compress_Tag> := at least one bit; for example <Compress_Tag> := 1
<Raw_Byte> := <b><b><b><b><b><b><b><b>    (8-bit byte data)
<b> := 0 | 1
<Compressed_Bytes> := <length><displacement>
<length>     :=     (code field)    (field value)    (token byte length)
                    00              ( 0)             ( 2 bytes)
                 |  01              ( 1)             ( 3 bytes)
                 |  10  00          ( 2)             ( 4 bytes)
                 |  10  01          ( 3)             ( 5 bytes)
                 |  10  10          ( 4)             ( 6 bytes)
```

TABLE 4-continued

| | | | | |
|---|---|---|---|---|
| \| | 10 | 11 | ( 5) | ( 7 bytes) |
| \| | 110 | 000 | ( 6) | ( 8 bytes) |
| \| | 110 | 001 | ( 7) | ( 9 bytes) |
| | ::: | ::: | ::::: | :::::::::: |
| \| | 110 | 110 | ( 12) | ( 14 bytes) |
| \| | 110 | 111 | ( 13) | ( 15 bytes) |
| \| | 1110 | 0000 | ( 14) | ( 16 bytes) |
| \| | 1110 | 0001 | ( 15) | ( 17 bytes) |
| | :::: | :::: | ::::: | :::::::::: |
| \| | 1110 | 1110 | ( 28) | ( 30 bytes) |
| \| | 1110 | 1111 | ( 29) | ( 31 bytes) |
| \| | 1111 | 0000 0000 | ( 30) | ( 32 bytes) |
| \| | 1111 | 0000 0001 | ( 31) | ( 33 bytes) |
| | :::: | :::: :::: | ::::: | :::::::::: |
| \| | 1111 | 1101 1110 | (252) | (254 bytes) |
| \| | 1111 | 1101 1111 | (253) | (255 bytes) |

```
<displacement>  :=  <b><b><b><b><b><b><b><b><b><b>   (10-bit field)
<Control>       :=  <Compress_Tag><Long_Control>
                |   <Compress_Tag><Short_Control>
<Long_Control>  :=  <Control Code><extensions>
                |   <Control Code><extension on byte boundary>
<Short_Control> :=  <Control Code>
<Control Code>  :=          (code field)        (field value)
                            1111 1110 0000      (254)
                |           1111 1110 0001      (255)
                            ::::::::::::        :::::
                |           1111 1111 1111      (285)
```

Table 5 provides a preferred embodiment of the "control" code assignments of this invention, including "special control codes" that occur only at the beginning of data blocks. The first bit of a compressed data stream is usually always zero because the history buffer is empty and the first source byte must be passed through as a raw byte. Thus, whenever the first bit of an encoded block is set to 1, a special control code follows.

TABLE 5

| | | |
|---|---|---|
| (Long_Control Code Assignment) | | |
| 1111 1110 0000 | .... < history buffer context selection > | L |
| 1111 1110 0001 | .... < byte count of uncompressed raw > | L |
| 1111 1110 0010 | .... < use different code book > | L |
| 1111 1110 0011 | .... < 2 byte CRC check > | L |
| 1111 1110 0100 | .... < 4 byte CRC check > | L |
| 1111 1110 0101 | .... < encryption code and key > | L |
| 1111 1110 0110 | .... < rate smoother, dummy code count > | L |
| 1111 1110 1000 | .... < history buffer context selection > | L,BA |
| 1111 1110 1001 | .... < byte count of uncompressed raw > | L,BA |
| 1111 1110 1010 | .... < use different code book > | L,BA |
| 1111 1110 1011 | .... < 2 byte CRC check > | L,BA |
| 1111 1110 1100 | .... < 4 byte CRC check > | L,BA |
| 1111 1110 1101 | .... < encryption code and key > | L,BA |
| 1111 1110 1110 | .... < rate smoother, dummy code count > | L,BA |
| L: long; | | |
| BA: byte aligned | | |
| (Short_Control Code Assignment) | | |
| 1111 1111 0000 | < short: reset current context > | |
| 1111 1111 0001 | < Fast Attack > | |
| 1111 1111 0010 | < 256B history buffer > | |
| 1111 1111 0011 | < 512B history buffer > | |
| 1111 1111 0100 | < 1024B history buffer > | |
| 1111 1111 0101 | < 2048B history buffer > | |
| 1111 1111 0110 | < 4096B history buffer > | |
| 1111 1111 0111 | < 8192B history buffer > | |
| 1111 1111 1000 | < short: freeze history buffer adaptation > | |
| ::::: ::::: | | |
| 1111 1111 1110 | < rate smoother, dummy code > | |
| 1111 1111 1111 | < short: end of file > | |
| (Special Control Codes) | | |
| (if the 1st bit of the 1st byte of the string is 1) | | |
| 11xx xxxx | < using Fast Attack > | |
| 10xx xxxx | < not using Fast Attack > | |
| 1x1x xxxx | < uncompressed string follows > | |
| 1x0x xxxx | < compressed string (default) > | |
| 1xx1 xxxx | < extended commands > | (next 8 bits are the lower 8 bits of regular commands) |
| 1xxx abcd | < "abcd" compress code version control > | |

Data Compressor Embodiments

The data compression process of this invention may be embodied in many computer systems for data storage and data transmission. Several examples of such systems are now described.

Figure 12:
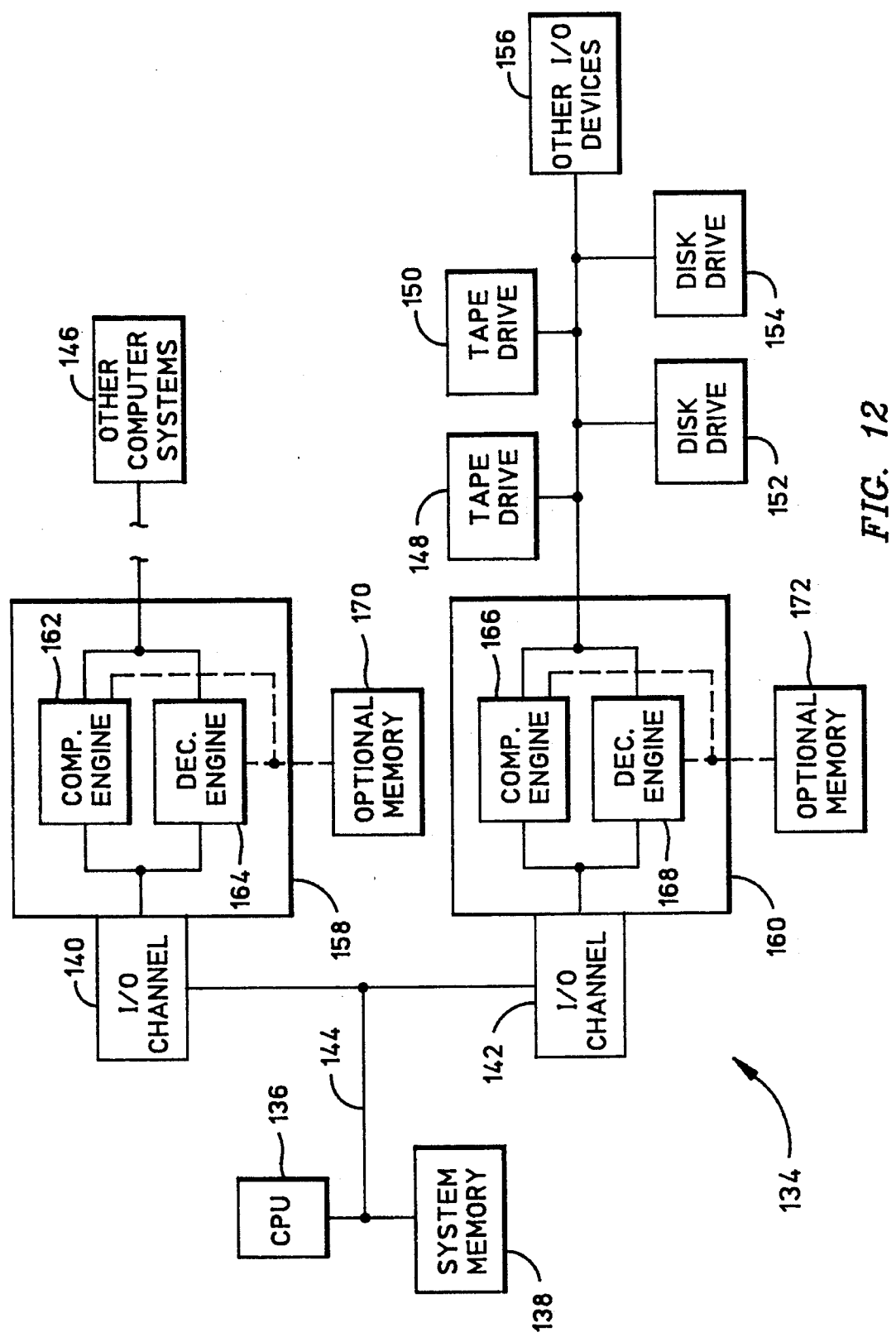
FIG. 12 is a functional block diagram of an exemplary data transmission system incorporating the data compression system of this invention.

FIGS. 11 and 12 are functional block diagrams of exemplary computer system configurations incorporating the data compression process of this invention. In FIG. 11, a computer system 100 includes a central processing unit (CPU) 102 that communicates with a system memory 104. CPU 102 also communicates on a bus 106 with several I/O channel adapters, exemplified by channel adapters 108 and 110. I/O channel adapter 108 permits CPU 102 to communicate with the other computer systems 112. I/O channel adapter 110 permits CPU 102 to communicate with a variety of I/O devices, exemplified by the disk drives 114 and 116, the tape drives 118 and 120, and the other I/O devices 122, which may include such storage devices as optical disks. In the preferred embodiment, computer system 100 also includes a data compression/decompression engine 124, which includes a data compression engine 126 and a data decompression engine 128. Compression/decompression engine 124 includes the several means necessary to implement the data compression and decompression process of this invention, all of which may be embodied as program objects and data objects stored in a memory means to direct CPU 102 to perform the processes of this invention. For instance, the program objects making up compression engine 126 and decompression engine 128 may be invoked by an operating system file handler run on CPU 102 to compress and/or decompress data transmitted or received through I/O channel adapters 108 and 110 on compressed data bus 130. Engine 124 may use system memory 104 or an optional memory 132 while performing the desired compression or decompression processes. When using optional memory 132, compressed and decompressed data may be transmitted directly to and from channel adapters 108 and 110 on bus 130.

In contrast to computer system 100 in FIG. 11, which is organized primarily to store and retrieve data in compressed form, FIG. 12 shows a computer system 134 organized primarily to transmit and receive data in compressed form. Computer system 134 includes a CPU 136 and a system memory 138. CPU 136 communicates with the two exemplary I/O channel adapters 140 and 142 on a high-speed data bus 144. By way of channel adapters 140 and 142, CPU 136 may communicate with the other computer systems 146, the tape drives 148 and 150, the disk drives 152 and 154, and the other I/O devices 156. Other computer systems 146 may include data transmission devices such as high-speed modems and network adapters. Channel adapters 140 and 142 each are directly coupled to a compression/decompression engine 158 and 160, respectively. Compression/decompression engine 158 includes a compression engine 162 and a decompression engine 164. Compression/decompression engine 160 includes a compression engine 166 and a decompression engine 168. As discussed above in connection with FIG. 11, engines 162, 164, 166 and 168 may be embodied either in special-purpose hardware or, more generally, as a plurality of program and data objects stored in a data memory means for directing CPU 136 to perform the processes of this invention. Engines 158 and 160 may also use the optional memories 170 and 172, respectively, for the program and data objects necessary to the process of this invention.

Figure 13:
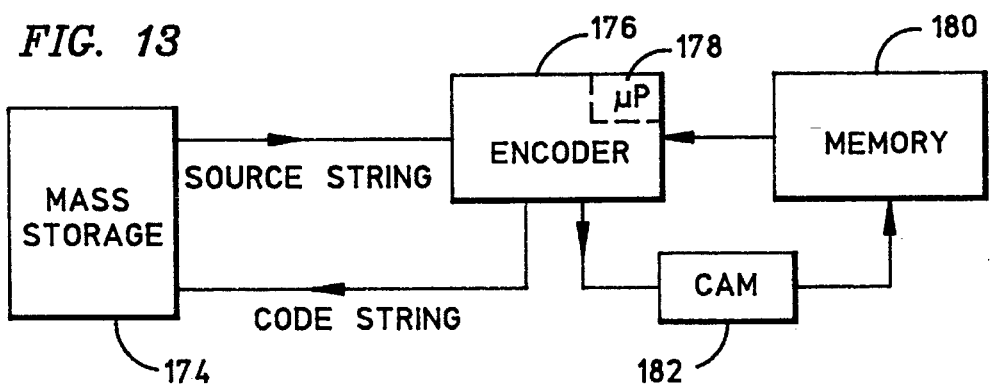
FIG. 13 is a functional block diagram of a system for compressing data during storage in accordance with the process of this invention.

There are many other useful embodiments of the process of this invention that may occur to those experienced in the computer processing arts. For instance, FIG. 13 illustrates a general data processing arrangement for converting uncompressed stored data from a mass storage device 174 into compressed data, thereby releasing memory space in mass storage device 174. An encoder 176 incorporating a microprocessor 178 is coupled to a data memory 180, which includes the program and data objects necessary to the data compression process of this invention. A content addressable memory (CAM) 182 is shown positioned to function as a history buffer means for storing and decorrelating the source symbol string.

Figure 14:
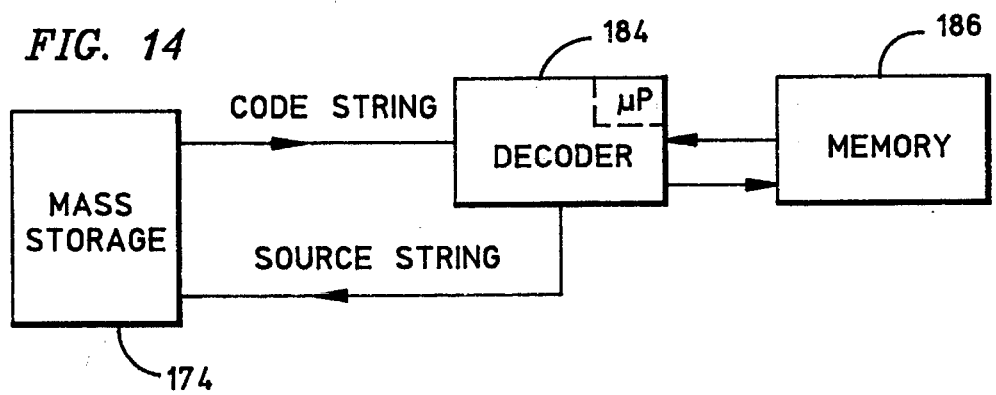
FIG. 14 is a functional block diagram of a system for decompressing stored data in accordance with the process of this invention.

FIG. 14 shows a decoding arrangement for converting code string data stored in mass storage device 174 to decompressed source data for restorage in device 174. A decoder 184 is coupled to a memory 186 in which is stored the program and data objects necessary to the decompression process of this invention. No CAM history buffer is required beyond a simple shift register for decoding.

Figure 15:
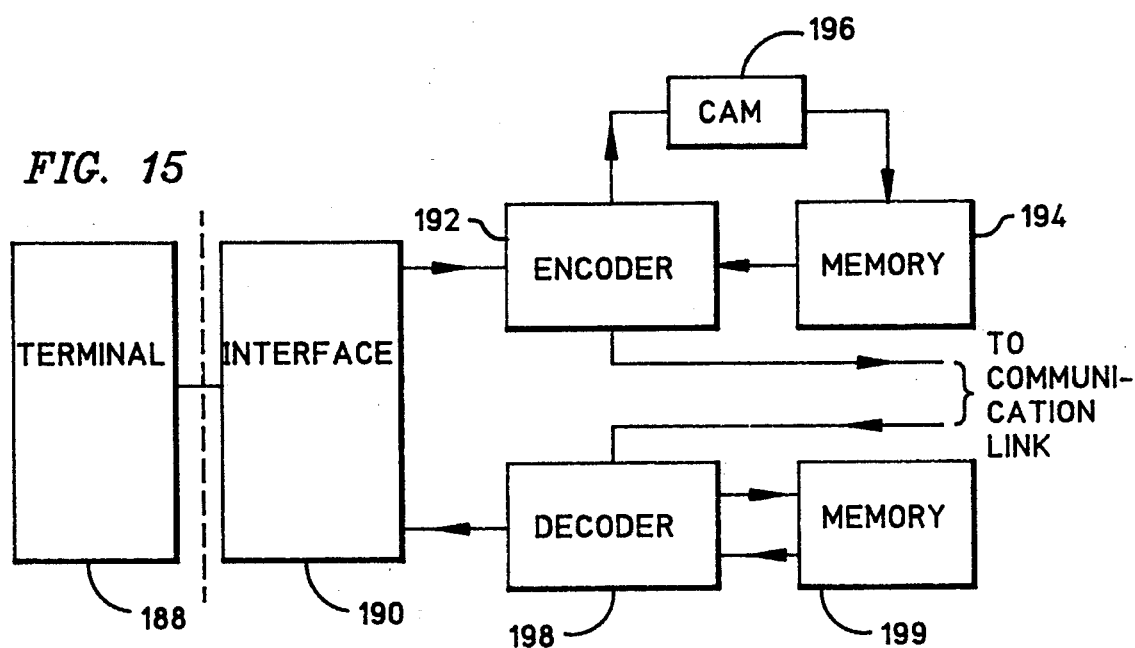
FIG. 15 is a functional block diagram of a system for transmitting and receiving compressed data in accordance with the process of this invention.

FIG. 15 shows a terminal 188 coupled to a terminal interface 190, which is arranged to transmit and receive data over a communications link by means of an encoder 192 coupled to a memory 194 and a CAM 196, and a decoder 198 coupled to a memory 199. The arrangement in FIG. 15 operates transparently to increase the data transmission capacity of the communication link by maximizing the information content per bit in the link data stream. While this invention is primarily discussed as a process, it can be understood by a person of ordinary skill in the art that the computer systems discussed above in connection with FIGS. 11–15 may be programmed or otherwise designed to facilitate the practice of this invention. Also, an article of manufacture for use with a computer system, such as the prerecorded floppy disk 200 shown in FIG. 16 or other similar computer program product, could include a storage medium, such as the magnetic storage medium 201, and program means recorded thereon, such as the program means 202, 204 and 206 recorded on storage medium 201, for directing a computer system to facilitate the process of this invention. It can be understood that such computer systems and such articles of manufacture also fall within the spirit and scope of this invention.

Clearly, other embodiments and modifications of this invention may occur readily to those of ordinary skill in the art in view of these teachings. Therefore, this invention is to be limited only by the following claims, which include all such embodiments and modifications when viewed in conjunction with the above specification and accompanying drawing.

We claim:

1. A method for encoding an input string of source symbols to produce an output string of code symbols comprising the steps of:

(a) storing the most recent available number $L_H$ of said source symbols in a history buffer means having capacity for storing a plurality $L_B$ of said source symbols, wherein $1 \leq L_H \leq L_B$ are positive integers;

(b) searching said most recent available source symbols in said history buffer means for a source symbol substring of length $L_M$ that matches a most recent plurality $L_M$ of said source symbols, wherein $L_M$, $L_H$ are positive integers;

(c) if a matching said source symbol sub-string of length $L_M$ is found to be located in said history buffer means at an offset equivalent to a plurality $L_O$ of said source symbols from said most recent source symbol plurality $L_M$, encoding said most recent source symbol plurality $L_M$ as a first said code symbol representing said length $L_M$ and a second said code symbol representing said offset $L_O$, wherein the number $N_H$ of bits in said second code symbol is reduced to no fewer than the number required to span said most recent available source symbol plurality $L_H$ in said history buffer means and wherein $L_O \leq L_H$ and $N_H$ are positive integers such that $N_H \leq \lceil \log_2(L_H) \rceil$; otherwise (d) encoding said most recent source symbol plurality $L_M$ unchanged as code symbols; and (e) passing said code symbols to said output code symbol string.

2. The method of claim 1 wherein said encoding step (c) comprises the step of:

(c.1) producing a first said code symbol representing an encoder control command and a second said code symbol representing an encoder control command extension.

3. The method of claim 2 wherein said encoding step (c) comprises the additional step of:

(c.2) selecting said first code symbol from one of a group G of said symbols having the same number N of bits to represent any said match length $L_M$ greater than a crossover threshold from a Laplacian match-length probability distribution to a Uniform match-length probability distribution; and (c.3) selecting said first code symbol from one of a plurality of groups $\{G_i\}$ of said symbols to represent each said match length $L_M$ less than said crossover threshold, wherein said symbols in each said group $G_i$ each have the same number $N_i$ of bits and wherein i and $N_i$ are positive integers.

4. The method of claim 3 further comprising the steps of:

(f) decoding said output code symbol string to produce a check string of decompressed source symbols;

(g) comparing said check source symbol string with said input source symbol string to detect any differences between said source symbol strings; and (h) generating one or more said encoder control commands responsive to any said differences between said source symbol strings.

5. The method of claim 4 wherein said matching step (b) comprises the step of:

(b.1) parsing all said matching source symbol sub-strings having length $L_M > T$ source symbols into a plurality of shorter said matching sub-strings, wherein T is a positive integer representing an upper limit on said matching sub-string length.

6. A method for encoding an input string of source symbols to produce an output string of code symbols comprising the steps of:

(a) storing the most recent available number $L_H$ of said source symbols in a history buffer means having capacity for storing a plurality $L_B$ of said source symbols, wherein $1 \leq L_H \leq L_B$ are positive integers;

(b) searching said most recent available source symbols in said history buffer means for a source symbol sub-string of length $L_M$ that matches a most recent plurality $L_M$ of said source symbols, wherein $L_M$, $L_H$ are positive integers;

(c) if a matching said source symbol sub-string of length $L_M$ is found to be located in said history buffer means at an offset equivalent to a plurality $L_O$ of said source symbols from said most recent source symbol plurality $L_M$, encoding said most recent source symbol plurality $L_M$ as a first said code symbol representing said length $L_M$ and a second said code symbol representing said offset $L_O$, wherein said first code symbol is selected from one of a group G of said symbols having the same number N of bits to represent any said match length $L_M$ greater than a crossover threshold from a Laplacian match-length probability distribution to a Uniform match-length probability distribution, said first code symbol is selected from one of a plurality of groups $\{G_i\}$ of said symbols to represent each said match length $L_M$ less than said crossover threshold, wherein said symbols in each said group $G_i$ each have the same number $N_i$ of bits, and wherein i and $N_i$ are positive integers; otherwise (d) encoding said most recent source symbol plurality $L_M$ unchanged as code symbols; and (e) passing said code symbols to said output code symbol string.

7. The method of claim 6 wherein said matching step (b) comprises the step of:

(b.1) parsing all said matching source symbol sub-strings having length $L_M > T$ source symbols into a plurality of shorter said matching sub-strings, wherein T is a positive integer representing an upper limit on said matching sub-string length.

8. A data compression apparatus comprising:

input means for accepting an input string of source symbols for compression;

history buffer means coupled to said input means for storing the most recent available number $L_H$ of said source symbols, said history buffer means having capacity for storing a plurality $L_B$ of said source symbols, wherein $1 \leq L_H \leq L_B$ are positive integers;

string comparator means coupled to said history buffer means and said input means for searching said most recent available source symbols in said history buffer means for a source symbol sub-string of length $L_M$ that matches a most recent plurality $L_M$ of said source symbols, wherein $L_M$, $L_H$ are positive integers;

first encoder means coupled to said history buffer means for encoding said most recent source symbol plurality $L_M$ as a first said code symbol representing said length $L_M$ and a second said code symbol representing the location in said history buffer means of said matching sub-string of $L_M$ source symbols expressed as an offset of a plurality $L_O$ of said source symbols from said most recent source symbol plurality $L_M$, wherein the number $N_H$ of bits in said second code symbol is reduced to no fewer than the number required to span said most recent available source symbol plurality $L_H$ in said history buffer means and wherein $L_O \leq L_H$ and $N_H$ are positive integers such that $N_H \leq \lceil \log_2(L_H) \rceil$;

output means coupled to said first encoder means for producing an output string of said code symbols representing the information contained in said input string compressed to remove redundancy; and raw data means coupled to said history buffer means and said output means for passing through to said output string each said most recent source symbol plurality $L_M$ for which said history buffer means contains no said matching source symbol sub-string.

9. The data compression apparatus of claim 8 further comprising:

control means coupled to said history buffer means for selecting from among a plurality of data compression operating modes;

second encoder means coupled to said control means and to said output means for producing a first said code symbol representing an encoder control command and a second said code symbol representing an encoder control command extension.

10. The data compression apparatus of claim 9 wherein said first encoder means comprises:

uniform bucket code means for selecting said first code symbol from one of a group G of said symbols having the same number N of bits to represent any said match length $L_M$ greater than a crossover threshold from a Laplacian match-length probability distribution to a Uniform match-length probability distribution; and Laplacian bucket code means for selecting said first code symbol from one of a plurality of groups $\{G_i\}$ of said symbols to represent each said match length $L_M$ less than said crossover threshold, wherein said symbols in each said group $G_i$ each have the same number $N_i$ of bits and wherein i and $N_i$ are positive integers.

11. The data compression apparatus of claim 10 further comprising:

check decoder means coupled to said output means for decoding said output code symbol string to produce a check string of decompressed source symbols;

check comparator means coupled to said check decoder means and said input means for comparing said check source symbol string with said input source symbol string to detect any differences between said source symbol strings; and error controller means in said control means coupled to said comparator means for generating one or more said encoder control commands responsive to any said differences between said source symbol strings.

12. The data compression apparatus of claim 11 wherein said string comparator means comprises:

dictionary limiter means for parsing all said matching source symbol sub-strings having length $L_M > T$ source symbols into a plurality of shorter said matching sub-strings, wherein T is a positive integer representing an upper limit on said matching sub-string length.

13. A data compression apparatus comprising:

input means for accepting an input string of source symbols for compression;

history buffer means coupled to said input means for storing the most recent available number $L_H$ of said source symbols, said history buffer means having capacity for storing a plurality $L_B$ of said source symbols, wherein $1 \leq L_H \leq L_B$ are positive integers;

string comparator means coupled to said history buffer means and said input means for searching said most recent available source symbols in said history buffer means for a source symbol sub-string of length $L_M$ that matches a most recent plurality $L_M$ of said source symbols, wherein $L_M$, $L_H$ are positive integers;

first encoder means coupled to said history buffer means for encoding said most recent source symbol plurality $L_M$ as a first said code symbol representing said length $L_M$ and a second said code symbol representing the location in said history buffer means of said matching sub-string of $L_M$ source symbols expressed as an offset of a plurality $L_O$ of said source symbols from said most recent source symbol plurality $L_M$;

uniform bucket code means for selecting said first code symbol from one of a group G of said symbols having the same number N of bits to represent any said match length $L_M$ greater than a crossover threshold from a Laplacian match-length probability distribution to a Uniform match-length probability distribution;

Laplacian bucket code means for selecting said first code symbol from one of a plurality of groups $\{G_i\}$ of said symbols to represent each said match length $L_M$ less than said crossover threshold, wherein said symbols in each said group $G_i$ each have the same number $N_i$ of bits and wherein i and $N_i$ are positive integers;

output means coupled to said first encoder means for producing an output string of said code symbols representing the information contained in said input string compressed to remove redundancy; and raw data means coupled to said history buffer means and said output means for passing through to said output string each said most recent source symbol plurality $L_M$ for which said history buffer means contains no said matching source symbol sub-string.

14. The data compression apparatus of claim 13 wherein said string comparator means comprises:

dictionary limiter means for parsing all said matching source symbol sub-strings having length $L_M > T$ source symbols into a plurality of shorter said matching sub-strings, wherein T is a positive integer representing an upper limit on said matching sub-string length.

15. A data storage system for storing digital data in compressed form including a data compression apparatus for encoding said digital data for storage, said system comprising:

input means for accepting an input string of source symbols representing said digital data to be compressed;

history buffer means coupled to said input means for storing the most recent available number $L_H$ of said source symbols, said history buffer means having capacity for storing a plurality $L_B$ of said source symbols, wherein $1 \leq L_H \leq L_B$ are positive integers;

string comparator means coupled to said history buffer means and said input means for searching said most recent available source symbols in said history buffer means for a source symbol sub-string of length $L_M$ that matches a most recent plurality $L_M$ of said source symbols, wherein $L_M$, $L_H$ are positive integers;

first encoder means coupled to said history buffer means for encoding said most recent source symbol plurality $L_M$ as a first said code symbol representing said length $L_M$ and a second said code symbol representing the location in said history buffer means of said matching sub-string of $L_M$ source symbols expressed as an offset of a plurality $L_O$ of said source symbols from said most recent source symbol plurality $L_M$, wherein the number $N_H$ of bits in said second code symbol is reduced to no fewer than the number required to span said most recent available source symbol plurality $L_H$ in said history buffer means and wherein $L_O \leq L_H$ and $N_H$ are positive integers such that $N_H \leq \lceil \log_2(L_H) \rceil$;

output means coupled to said first encoder means for producing an output string of said code symbols representing the information contained in said input string compressed to remove redundancy;

raw data means coupled to said history buffer means and said output means for passing through to said output string each said most recent source symbol plurality $L_M$ for which said history buffer means contains no said matching source symbol sub-string; and data storage means coupled to said output means for storing said output code symbol string representing said compressed digital data.

16. The data storage system of claim 15 further comprising:

control means coupled to said history buffer means for selecting from among a plurality of data compression operating modes;

second encoder means coupled to said control means and to said output means for producing a first said code symbol representing an encoder control command and a second said code symbol representing an encoder control command extension.

17. The data storage system of claim 16 wherein said first encoder means comprises:

uniform bucket code means for selecting said first code symbol from one of a group G of said symbols having the same number N of bits to represent any said match length $L_M$ greater than a crossover threshold from a Laplacian match-length probability distribution to a Uniform match length-probability distribution; and Laplacian bucket code means for selecting said first code symbol from one of a plurality of groups $\{G_i\}$ of said symbols to represent each said match length $L_M$ less than said crossover threshold, wherein said symbols in each said group $G_i$ each have the same number $N_i$ of bits and wherein i and $N_i$ are positive integers.

18. The data storage system of claim 17 further comprising:

check decoder means coupled to said output means for decoding said output code symbol string to produce a check string of decompressed source symbols;

check comparator means coupled to said check decoder means and said input means for comparing said check source symbol string with said input source symbol string to produce a CRC code string representing any differences between said source symbol strings; and error controller means in said control means coupled to said comparator means for generating one or more said encoder control commands responsive to said CRC code string.

19. The data storage system of claim 18 wherein said string comparator means comprises:

dictionary limiter means for parsing all said matching source symbol sub-strings having length $L_M$>T source symbols into a plurality of shorter said matching sub-strings, wherein T is a positive integer representing an upper limit on said matching sub-string length.

20. A data storage system comprising:

input means for accepting an input string of source symbols for compression;

history buffer means coupled to said input means for storing the most recent available number $L_H$ of said source symbols, said history buffer means having capacity for storing a plurality $L_B$ of said source symbols, wherein $1 \leq L_H \leq L_B$ are positive integers;

string comparator means coupled to said history buffer means and said input means for searching said most recent available source symbols in said history buffer means for a source symbol sub-string of length $L_M$ that matches a most recent plurality $L_M$ of said source symbols, wherein $L_M$, $L_H$ are positive integers;

first encoder means coupled to said history buffer means for encoding said most recent source symbol plurality $L_M$ as a first said code symbol representing said length $L_M$ and a second said code symbol representing the location in said history buffer means of said matching sub-string of $L_M$ source symbols expressed as an offset of a plurality $L_O$ of said source symbols from said most recent source symbol plurality $L_M$;

uniform bucket code means for selecting said first code symbol from one of a group G of said symbols having the same number N of bits to represent any said match length $L_M$ greater than a crossover threshold from a Laplacian match-length probability distribution to a Uniform match-length probability distribution;

Laplacian bucket code means for selecting said first code symbol from one of a plurality of groups $\{G_i\}$ of said symbols to represent each said match length $L_M$ less than said crossover threshold, wherein said symbols in each said group $G_i$ each have the same number $N_i$ of bits and wherein i and $N_i$ are positive integers;

output means coupled to said first encoder means for producing an output string of said code symbols representing the information contained in said input string compressed to remove redundancy; and raw data means coupled to said history buffer means and said output means for passing through to said output string each said most recent source symbol plurality $L_M$ for which said history buffer means contains no said matching source symbol sub-string.

21. The data storage system of claim 20 wherein said string comparator means comprises:

dictionary limiter means for parsing all said matching source symbol sub-strings having length $L_M$>T source symbols into a plurality of shorter said matching sub-strings, wherein T is a positive integer representing an upper limit on said matching sub-string length.

22. A data transmission system for transferring digital data in compressed form including a data compression apparatus for encoding said digital data for transmission, said system comprising:

input means for accepting an input string of source symbols representing said digital data to be compressed;

history buffer means coupled to said input means for storing the most recent available number $L_H$ of said source symbols, said history buffer means having capacity for storing a plurality $L_B$ of said source symbols, wherein $1 \leq L_H \leq L_B$ are positive integers;

string comparator means coupled to said history buffer means and said input means for searching said most recent available source symbols in said history buffer means for a source symbol sub-string of length $L_M$ that matches a most recent plurality $L_M$ of said source symbols, wherein $L_M$, $L_H$ are positive integers;

first encoder means coupled to said history buffer means for encoding said most recent source symbol plurality $L_M$ as a first said code symbol representing said length $L_M$ and a second said code symbol representing the location in said history buffer means of said matching sub-string of $L_M$ source symbols expressed as an offset of a plurality $L_O$ of said source symbols from said most recent source symbol plurality $L_M$, wherein the number $N_H$ of bits in said second code symbol is reduced to no fewer than the number required to span said most recent available source symbol plurality $L_H$ in said history buffer means and wherein $L_O \leq L_H$ and $N_H$ are positive integers such that $N_H \leq \lceil \log_2(L_H) \rceil$;

output means coupled to said first encoder means for producing an output string of said code symbols representing the information contained in said input string compressed to remove redundancy;

raw data means coupled to said history buffer means and said output means for passing through to said output string each said most recent source symbol plurality $L_M$ for which said history buffer means contains no said matching source symbol sub-string; and data transmitter means coupled to said output means for transmitting said output code symbol string representing said compressed digital data.

23. The data transmission system of claim 22 further comprising:

control means coupled to said history buffer means for selecting from among a plurality of data compression operating modes;

second encoder means coupled to said control means and to said output means for producing a first said code symbol representing an encoder control command and a second said code symbol representing an encoder control command extension.

24. The data transmission system of claim 23 wherein said first encoder means comprises:

uniform bucket code means for selecting said first code symbol from one of a group G of said symbols having the same number N of bits to represent any said match length $L_M$ greater than a crossover threshold from a Laplacian match-length probability distribution to a Uniform match-length probability distribution; and Laplacian bucket code means for selecting said first code symbol from one of a plurality of groups $\{G_i\}$ of said symbols to represent each said match length $L_M$ less than said crossover threshold, wherein said symbols in each said group $G_i$ each have the same number $N_i$ of bits and wherein i and $N_i$ are positive integers.

25. The data transmission system of claim 24 further comprising:

check decoder means coupled to said output means for decoding said output code symbol string to produce a check string of decompressed source symbols;

check comparator means coupled to said check decoder means and said input means for comparing said check source symbol string with said input source symbol string to detect any differences between said source symbol strings; and error controller means in said control means coupled to said comparator means for generating one or more said encoder control commands responsive to any said differences between said source symbol strings.

26. The data transmission system of claim 25 wherein said string comparator means comprises:

dictionary limiter means for parsing all said matching source symbol sub-strings having length $L_M$>T source symbols into a plurality of shorter said matching sub-strings, wherein T is a positive integer representing an upper limit on said matching sub-string length.

27. A data transmission system for transferring digital data in compressed form including a data compression apparatus for encoding said digital data for transmission, said system comprising:

input means for accepting an input string of source symbols for compression;

history buffer means coupled to said input means for storing the most recent available number $L_H$ of said source symbols, said history buffer means having capacity for storing a plurality $L_B$ of said source symbols, wherein $1 \leq L_H \leq L_B$ are positive integers;

string comparator means coupled to said history buffer means and said input means for searching said most recent available source symbols in said history buffer means for a source symbol sub-string of length $L_M$ that matches a most recent plurality $L_M$ of said source symbols, wherein $L_M$, $L_H$ are positive integers;

first encoder means coupled to said history buffer means for encoding said most recent source symbol plurality $L_M$ as a first said code symbol representing said length $L_M$ and a second said code symbol representing the location in said history buffer means of said matching sub-string of $L_M$ source symbols expressed as an offset of a plurality $L_O$ of said source symbols from said most recent source symbol plurality $L_M$;

uniform bucket code means for selecting said first code symbol from one of a group G of said symbols having the same number N of bits to represent any said match length $L_M$ greater than a crossover threshold from a Laplacian match-length probability distribution to a Uniform match-length probability distribution;

Laplacian bucket code means for selecting said first code symbol from one of a plurality of groups $\{G_i\}$ of said symbols to represent each said match length $L_M$ less than said crossover threshold, wherein said symbols in each said group $G_i$ each have the same number $N_i$ of bits and wherein i and $N_i$ are positive integers;

output means coupled to said first encoder means for producing an output string of said code symbols representing the information contained in said input string compressed to remove redundancy; and raw data means coupled to said history buffer means and said output means for passing through to said output string each said most recent source symbol plurality $L_M$ for which said history buffer means contains no said matching source symbol sub-string.

28. The data transmission system of claim 27 wherein said string comparator means comprises:

dictionary limiter means for parsing all said matching source symbol sub-strings having length $L_M$>T source symbols into a plurality of shorter said matching sub-strings, wherein T is a positive integer representing an upper limit on said matching sub-string length.

29. A computer program product for use with a computer system for encoding an input string of source symbols to produce an output string of code symbols, said computer program product comprising:

a recording medium;

means, recorded on said recording medium, for directing said computer system to store the most recent available number $L_H$ of said source symbols in a history buffer means having capacity for storing a plurality $L_B$ of said source symbols, wherein $1 \leq L_H \leq L_B$ are positive integers;

means, recorded on said recording medium, for directing said computer system to search said most recent available source symbols in said history buffer means for a source symbol sub-string of length $L_M$ that matches a most recent plurality $L_M$ of said source symbols, wherein $L_M$, $L_H$ are positive integers;

means, recorded on said recording medium, for directing said computer system to encode said most recent source symbol plurality $L_M$ as a first said code symbol representing said length $L_M$ and a second said code symbol representing an offset $L_O$ if a matching said source symbol sub-string of length $L_M$ is found to be located in said history buffer means at said offset $L_O$ of said source symbols from said most recent source symbol plurality $L_M$, wherein the number $N_H$ of bits in said second code symbol is reduced to no fewer than the number required to span said most recent available source symbol plurality $L_H$ in said history buffer means and wherein $L_O \leq L_H$ and $N_H$ are positive integers such that $N_H \leq \lceil \log_2(L_H) \rceil$;

means, recorded on said recording medium, for directing said computer system to encode said most recent source symbol plurality $L_M$ unchanged as code symbols when said matching sub-string of $L_M$ source symbols is not found in said history buffer means; and means, recorded on said recording medium, for directing said computer system to pass said code symbols to said output code symbol string.

30. The computer program product of claim 29 further comprising:

means, recorded on said recording medium, for directing said computer system to produce a first said code symbol representing an encoder control command and a second said code symbol representing an encoder control command extension.

31. The computer program product of claim 30 further comprising:

means, recorded on said recording medium, for directing said computer system to select said first code symbol from one of a group G of said symbols having the same number N of bits to represent any said match length $L_M$ greater than a crossover threshold from a Laplacian match-length probability distribution to a Uniform match-length probability distribution; and means, recorded on said recording medium, for directing said computer system to select said first code symbol from one of a plurality of groups $\{G_i\}$ of said symbols to represent each said match length $L_M$ less than said crossover threshold, wherein said symbols in each said group $G_i$ each have the same number $N_i$ of bits and wherein i and $N_i$ are positive integers.

32. The computer program product of claim 31 further comprising:

means, recorded on said recording medium, for directing said computer system to decode said output code symbol string to produce a check string of decompressed source symbols;

means, recorded on said recording medium, for directing said computer system to compare said check source symbol string with said input source symbol string and to produce a CRC code string representing any differences between said source symbol strings; and means, recorded on said recording medium, for directing said computer system to generate one or more said encoder control commands responsive to said CRC code string.

33. The computer program product of claim 32 further comprising:

means, recorded on said recording medium, for directing said computer system to parse all said matching source symbol sub-strings having length $L_M > T$ source symbols into a plurality of shorter said matching sub-strings, wherein T is a positive integer representing an upper limit on said matching sub-string length.

34. A computer program product for use with a computer system for encoding an input string of source symbols to produce an output string of code symbols, said computer program product comprising:

a recording medium;

means, recorded on said recording medium, for directing said computer system to store the most recent available number $L_H$ of said source symbols in a history buffer means having capacity for storing a plurality $L_B$ of said source symbols, wherein $1 \leq L_H \leq L_B$ are positive integers;

means, recorded on said recording medium, for directing said computer system to search said most recent available source symbols in said history buffer means for a source symbol sub-string of length $L_M$ that matches a most recent plurality $L_M$ of said source symbols, wherein $L_M$, $L_H$ are positive integers;

means, recorded on said recording medium, for directing said computer system to encode said most recent source symbol plurality $L_M$ as a first said code symbol representing said length $L_M$ and a second said code symbol representing an offset $L_O$ if a matching said source symbol sub-string of length $L_M$ is found to be located in said history buffer means at said offset $L_O$ of said source symbols from said most recent source symbol plurality $L_M$, wherein said first code symbol is selected from one of a group G of said symbols having the same number N of bits to represent any said match length $L_M$ greater than a crossover threshold from a Laplacian match-length probability distribution to a Uniform match-length probability distribution, said first code symbol is selected from one of a plurality of groups $\{G_i\}$ of said symbols to represent each said match length $L_M$ less than said crossover threshold, wherein said symbols in each said group $G_i$ each have the same number $N_i$ of bits, and wherein i and $N_i$ are positive integers;

means, recorded on said recording medium, for directing said computer system to encode said most recent source symbol plurality $L_M$ unchanged as code symbols when said matching sub-string of $L_M$ source symbols is not found in said history buffer means; and means, recorded on said recording medium, for directing said computer system to pass said code symbols to said output code symbol string.

35. The computer program product of claim 34 further comprising:

means, recorded on said recording medium, for directing said computer system to parse all said matching source symbol sub-strings having length $L_M > T$ source symbols into a plurality of shorter said matching sub-strings, wherein T is a positive integer representing an upper limit on said matching sub-string length.

* * * * *